(12) United States Patent
Choi et al.

(10) Patent No.: US 9,960,182 B2
(45) Date of Patent: May 1, 2018

(54) THREE-DIMENSIONAL SEMICONDUCTOR MEMORY DEVICE AND METHOD OF FABRICATING THE SAME

(71) Applicant: SAMSUNG ELECTRONICS CO., LTD., Suwon-si, Gyeonggi-do (KR)

(72) Inventors: Ji-Hoon Choi, Seongnam-si (KR); SeungHyun Lim, Seoul (KR); Sunggil Kim, Yongin-si (KR); HongSuk Kim, Yongin-si (KR); Hunhyeong Lim, Hwaseong-si (KR); Hyunjun Sim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/634,555

(22) Filed: Jun. 27, 2017

(65) Prior Publication Data

US 2017/0301689 A1    Oct. 19, 2017

Related U.S. Application Data

(63) Continuation of application No. 15/066,619, filed on Mar. 10, 2016.

(30) Foreign Application Priority Data

Mar. 17, 2015 (KR) .......................... 10-2015-0036839

(51) Int. Cl.
*H01L 27/115* (2017.01)
*H01L 29/10* (2006.01)
*H01L 27/11582* (2017.01)
*H01L 27/11565* (2017.01)
*H01L 27/1157* (2017.01)

(52) U.S. Cl.
CPC .... *H01L 27/11582* (2013.01); *H01L 27/1157* (2013.01); *H01L 27/11565* (2013.01)

(58) Field of Classification Search
None
See application file for complete search history.

(56) References Cited

U.S. PATENT DOCUMENTS

| 2012/0086072 | A1* | 4/2012 | Yun | H01L 27/11578 257/329 |
| 2013/0134492 | A1* | 5/2013 | Yang | H01L 27/1157 257/314 |
| 2013/0270625 | A1* | 10/2013 | Jang | H01L 29/7926 257/324 |
| 2016/0276365 | A1 | 9/2016 | Choi et al. | |

* cited by examiner

*Primary Examiner* — Khaja Ahmad
(74) *Attorney, Agent, or Firm* — F. Chau & Associates, LLC

(57) ABSTRACT

A semiconductor memory device includes a stack including gate electrodes sequentially stacked on a substrate, a vertical insulating structure penetrating the stack vertically with respect to the gate electrodes, a vertical channel portion disposed on an inner side surface of the vertical insulating structure, and a common source region formed in the substrate and spaced apart from the vertical channel portion. A bottom region of the vertical channel portion has a protruding surface in contact with a bottom region of the vertical insulating structure.

11 Claims, 41 Drawing Sheets

THREE-DIMENSIONAL SEMICONDUCTOR MEMORY DEVICE AND METHOD OF FABRICATING THE SAME

CROSS-REFERENCE TO RELATED APPLICATION

This application is a continuation of co-pending U.S. application Ser. No. 15/066,619 filed on Mar. 10, 2016, which claims priority under 35 U.S.C. § 119 to Korean Patent Application No. 10-2015-0036839 filed on Mar. 17, 2015 in the Korean Intellectual Property Office, the disclosures of which are incorporated by reference herein in their entireties.

TECHNICAL FIELD

Exemplary embodiments of the inventive concept relate to a semiconductor device and a method of fabricating the same, and in particular, to a three-dimensional (3D) semiconductor memory device and a method of fabricating the same.

DISCUSSION OF THE RELATED ART

The degree of integration of a semiconductor device is a factor of the cost of such device. In the case of two-dimensional (2D) or planar semiconductor memory devices, since their integration is determined by the area occupied by a unit memory cell, integration depends on how small the patterns of the semiconductor can be formed. However, the cost of equipment that forms minute patterns is high.

Three-dimensional (3D) semiconductor devices including three-dimensionally-arranged memory cells may increase the degree of integration of semiconductor devices. However, manufacturing obstacles are encountered in achieving low-cost, mass-production 3D semiconductor memory devices. The manufacturing obstacles may affect the reliability of such devices.

SUMMARY

According to an exemplary embodiment of the inventive concept, a semiconductor memory device includes a stack including gate electrodes sequentially stacked on a substrate. A vertical insulating structure penetrates the stack vertically with respect to the gate electrodes. A vertical channel portion is disposed on an inner surface of the vertical insulating structure. A common source region is formed in the substrate and is spaced apart from the vertical channel portion. A bottom region of the vertical channel portion has a protruding surface in contact with a bottom region of the vertical insulating structure.

In an exemplary embodiment of the inventive concept, the protruding surface of the bottom region of the vertical channel portion has a curved profile.

In an exemplary embodiment of the inventive concept, the protruding surface of the bottom region of the vertical channel portion has a vertical side profile.

In an exemplary embodiment of the inventive concept, the protruding surface of the bottom region of the vertical channel portion is connected to a bottom surface of the bottom region of the vertical channel portion to form an angular profile.

In an exemplary embodiment of the inventive concept, the protruding surface of the bottom region of the vertical channel portion is connected to a bottom surface of the bottom region of the vertical channel portion to form a curved profile.

In an exemplary embodiment of the inventive concept, the bottom region of the vertical channel portion has a larger width than a top region of the vertical channel portion.

In an exemplary embodiment of the inventive concept, the vertical insulating structure has a smaller width between the stack and the bottom region of the vertical channel portion than between the stack and a top region of the vertical channel portion.

In an exemplary embodiment of the inventive concept, the vertical channel portion comprises a first channel portion and a second channel portion disposed between the first channel portion and the vertical insulating structure, a top region of the vertical channel portion comprises an upper first channel portion of the first channel portion and the second channel portion, and the bottom region of the vertical channel portion comprises a lower first channel portion of the first channel portion.

In an exemplary embodiment of the inventive concept, the semiconductor memory device further includes a lower channel protruding from the substrate in a vertical direction with respect to the gate electrodes and being in contact with the vertical channel portion, wherein a first portion of a top surface of the lower channel is in contact with a bottom surface of the vertical channel portion, and a second portion of the top surface of the lower channel is in contact with a bottom surface of the vertical insulating structure.

According to an exemplary embodiment of the inventive concept, a semiconductor memory device includes a stack including gate electrodes sequentially stacked on a substrate. A vertical insulating structure penetrates the stack vertically with respect to the gate electrodes. A vertical channel portion is disposed on an inner surface of the vertical insulating structure. A common source region is formed in the substrate and is spaced apart from the vertical channel portion. The vertical channel portion the vertical channel portion includes a first channel pattern and a second channel pattern. The first channel pattern partially covers an inner surface of the vertical insulating structure. The second channel pattern includes an upper second channel pattern covering an inner surface of the first channel pattern and a lower second channel pattern disposed below the first channel pattern. An outer surface portion of the lower second channel pattern protrudes a bottom portion of the vertical insulating structure exposed by the first channel pattern and contacts the bottom portion of the vertical insulating structure exposed by the first channel pattern.

In an exemplary embodiment of the inventive concept, a width of the lower second channel pattern is larger than a sum of widths of the upper second channel pattern and the first channel pattern.

In an exemplary embodiment of the inventive concept, the vertical insulating structure comprises a plurality of layers, an outer surface of the first channel pattern is in contact with one of the layers of the vertical insulating structure, and the outer surface portion of the lower second channel pattern is in contact with at least one of the layers of the vertical insulating structure.

In an exemplary embodiment of the inventive concept, the vertical insulating structure comprises a first insulating layer, a second insulating layer, and a third insulating layer sequentially stacked on an inner surface of the stack, the outer surface of the first channel pattern is in contact with the third insulating layer, and the outer surface portion of the lower second channel pattern is in contact with bottom portions of the first, second, and third insulating layers.

In an exemplary embodiment of the inventive concept, the outer surface portion of the lower second channel pattern has a curved profile.

In an exemplary embodiment of the inventive concept, a bottom surface of the first channel pattern is spaced apart from the lower second channel pattern.

According to an exemplary embodiment of the inventive concept, a semiconductor memory device includes a stack including gate electrodes sequentially disposed on a substrate. A vertical insulating structure penetrates the stack substantially perpendicularly with respect to the gate electrodes. A vertical channel portion is disposed on an inner surface of the vertical insulating structure and extends in a same direction as the vertical insulating structure. A common source region is formed in the substrate and is spaced apart from the vertical channel portion. A bottom region of the vertical channel portion includes an outer surface that is extended toward an outer surface of the vertical insulating structure and contacts the vertical insulating structure.

In an exemplary embodiment of the inventive concept, the vertical channel portion includes a first channel pattern and a second channel pattern. The first channel pattern is disposed on an inner surface of the vertical insulating structure, and the second channel pattern is disposed on an inner surface of the first channel pattern. The second channel pattern includes a lower second channel pattern and an upper second channel pattern disposed on the lower second channel pattern. A portion of an outer surface of the lower second channel pattern corresponds to the outer surface of the bottom region of the vertical channel portion that is extended toward the outer surface of the vertical insulating structure and contacts the vertical insulating structure.

In an exemplary embodiment of the inventive concept, a first circumference of the first channel pattern decreases in a direction toward the substrate, and a second circumference of the second channel pattern decreases in the direction toward the substrate.

In an exemplary embodiment of the inventive concept, a bottom portion of the first channel pattern is spaced apart from the lower second channel pattern.

In an exemplary embodiment of the inventive concept, a bottom portion of the first channel pattern contacts the lower second channel pattern.

In an exemplary embodiment of the inventive concept, the portion of the outer surface of the lower second channel pattern is curved.

In an exemplary embodiment of the inventive concept, the portion of the outer surface of the lower second channel pattern includes a flat region.

In an exemplary embodiment of the inventive concept, a top surface of the lower second channel pattern is separated from a bottom portion of the first channel pattern. The top surface of the lower second channel pattern is disposed closer to the substrate than the bottom portion of the first channel pattern, or the top surface of the lower second channel pattern and the bottom portion of the first channel pattern are disposed equally distant from the substrate.

BRIEF DESCRIPTION OF THE DRAWINGS

Exemplary embodiments of the inventive concept will become more clearly understood when described in detail with reference to the accompanying drawings. The accompanying drawings illustrate non-limiting, exemplary embodiments of the inventive concept.

DETAILED DESCRIPTION OF THE EMBODIMENTS

Figure 1:
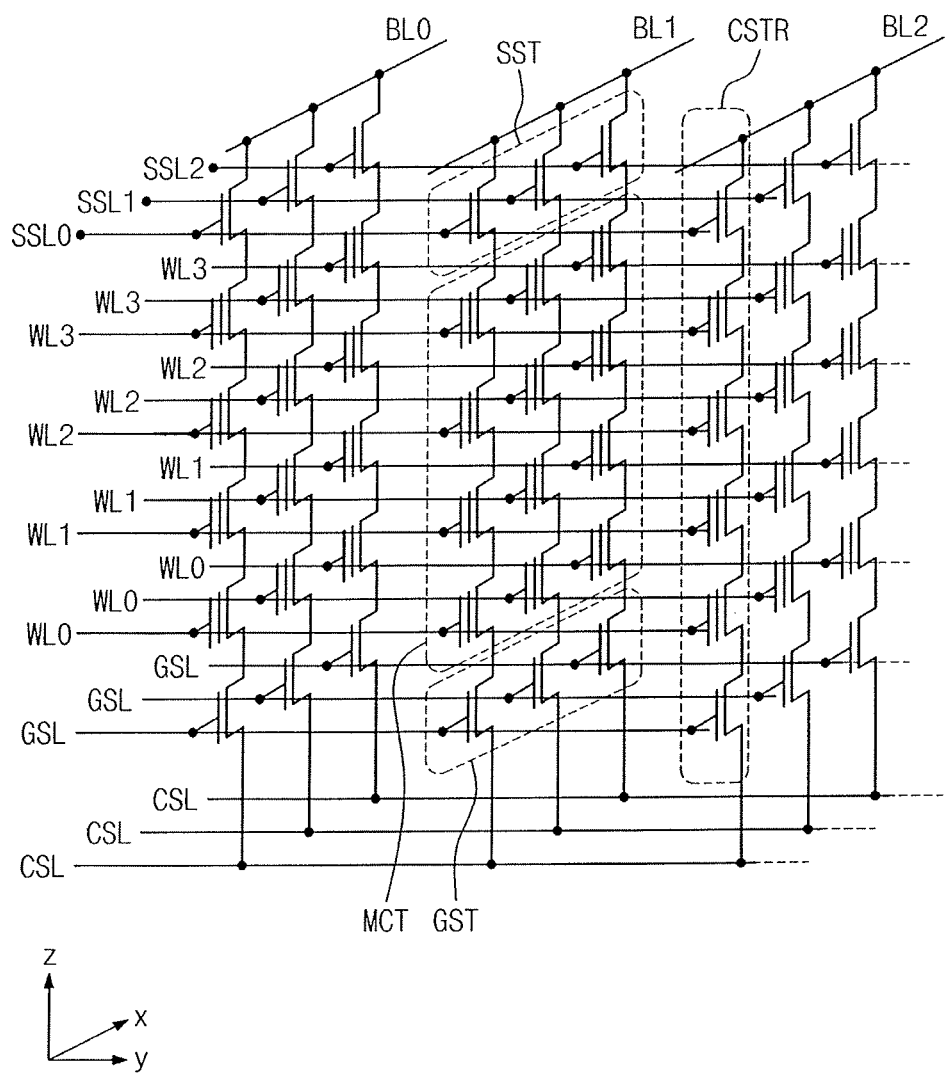
FIG. 1 is a circuit diagram schematically illustrating a portion of a cell array of a memory device, according to an exemplary embodiment of the inventive concept.

Exemplary embodiments of the inventive concepts will be described more fully hereinafter with reference to the accompanying drawings. The present invention may, however, be embodied in many different forms and should not be construed as being limited to the embodiments thereof set forth herein. The exemplary embodiments of the inventive concept disclosed herein are provided to convey the inventive concept to those of ordinary skill in the art. In the drawings, the thicknesses of layers and regions may be exaggerated for clarity. Like reference numerals in the drawings may denote like elements throughout the specification. Thus a duplicate description thereof may be omitted.

It will be understood that when an element is referred to as being "connected" or "coupled" to another element, it can be directly connected or coupled to the other element or intervening elements may be present. As used herein the term "and/or" includes any and all combinations of one or more of the associated listed items. Spatially relative terms, such as "beneath," "below," "lower," "above," "upper", and the like, may be used herein for ease of description to describe the relationship of an element or a feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

As used herein, the singular forms "a", "an", and "the" are intended to include the plural forms as well, unless the context clearly indicates otherwise.

Exemplary embodiments of the inventive concepts are described herein with reference to cross-sectional illustrations that are schematic illustrations of idealized exemplary embodiments and intermediate structures of exemplary embodiments of the inventive concept. As such, variations from the shapes of the illustrations as a result of, for example, manufacturing techniques and/or tolerances, may be expected. Thus, exemplary embodiments of the inventive concepts should not be construed as limited to the particular shapes of regions illustrated herein but are to include deviations in shapes that result from, for example, manufacturing. For example, an implanted region illustrated as a rectangle may have rounded or curved features and/or a gradient of implant concentration at its edges rather than a binary change from the implanted to the non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Devices and methods of forming devices according to various exemplary embodiments described herein may be embodied in microelectronic devices such as integrated circuits, wherein a plurality of devices according to various exemplary embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various exemplary embodiments of the inventive concept may include a plurality of the devices in an array and/or in a two-dimensional pattern that is based on the functionality of the microelectronic device.

The devices, according to various exemplary embodiments described herein, may be interspersed among other devices depending on the functionality of the microelectronic device. Moreover, microelectronic devices, according to various exemplary embodiments described herein, may be replicated in a third direction that may be orthogonal to the two different directions, to provide three-dimensional integrated circuits.

Accordingly, the cross-sectional view(s) illustrated herein provide support for a plurality of devices according to various exemplary embodiments described herein that extend along two different directions in a plan view and/or in three different directions in a perspective view. For example, when a single active region is illustrated in a cross-sectional view of a device/structure, the device/structure may include a plurality of active regions and transistor structures or memory cell structures, gate structures, etc., as appropriate to the case, thereon, as would be illustrated by a plan view of the device/structure.

Unless otherwise defined, all terms including technical and scientific terms used herein have the same meaning as commonly understood by one of ordinary skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a circuit diagram schematically illustrating a portion of a cell array of a memory device, according to an exemplary embodiment of the inventive concept.

Referring to FIG. 1, a semiconductor memory device may include a common source line CSL, a plurality of bit lines BL0, BL1, and BL2, and a plurality of cell strings CSTR disposed between the common source line CSL and the bit lines BL0-BL2. The common source line CSL may be included in a common source region formed in the substrate and spaced apart from a vertical channel portion VS.

The common source line CSL may be a conductive layer disposed on a substrate (e.g., a semiconductor substrate) or an impurity region formed in the substrate. The bit lines BL0-BL2 may be conductive patterns (e.g., metal lines) disposed over the substrate and separated from the substrate. The bit lines BL0-BL2 may be two-dimensionally arranged on the substrate, and the plurality of cell strings CSTR may be electrically connected in parallel to each of the bit lines BL0-BL2. Accordingly, the cell strings CSTR may also be two-dimensionally arranged on the common source line CSL or the substrate.

Each of the cell strings CSTR may be configured to include a ground selection transistor GST connected to the common source line CSL, a string selection transistor SST connected to one of the bit lines BL0-BL2, and a plurality of memory cell transistors MCT disposed between ground and string selection transistors GST and SST. The ground selection transistor GST, the memory cell transistors MCT, and the string selection transistor SST constituting each of the cell strings CSTR may be serially connected to each other. Furthermore, a ground selection line GSL, a plurality of word lines WL0-WL3 and a plurality of string selection lines SSL0-SSL2 may be provided between the common source line CSL and the bit lines BL0-BL2 to serve as gate electrodes of the ground selection transistor GST, the memory cell transistors MCT, and the string selection transistors SST, respectively.

The ground selection transistors GST may be disposed at the same level (e.g., at substantially the same height from the substrate), and the gate electrodes thereof may be connected in common to the ground selection line GSL, thereby being in an equipotential state. Accordingly, the ground selection line GSL may be a plate-shaped conductive pattern or a comb-shaped conductive pattern which is disposed between the common source line CSL and the lowermost memory cell transistors MCT closest to the common source line CSL. Similarly, the gate electrodes of the memory cell transistors MCT located at the same level may also be connected in common to one of the word lines WL0-WL3, thereby being in an equipotential state. For example, each of the word lines WL0 to WL3 may be a plate-shaped or comb-shaped conductive pattern which is parallel with the substrate. Since each of the cell strings CSTR includes a plurality of the memory cell transistors MCT disposed at different levels from each other, the word lines WL0-WL3 may have a multi-layered structure between the common source line CSL and the bit lines BL0-BL2.

In addition, each of the cell strings CSTR may include a channel structure that vertically extends from the common source line CSL and is connected to a corresponding one of the bit lines BL0-BL2. The channel structures may be formed to penetrate the ground selection line GSL and the word lines WL0-WL3. Furthermore, each of the channel structures may include a body portion and impurity regions formed in both ends of the body portion. For example, a drain region may be formed in a top portion of a semiconductor pattern of the channel structure.

A memory layer may be provided between the word lines WL0-WL3 and the channel structure. In an exemplary embodiment of the inventive concept, the memory layer may include a charge storing layer.

A dielectric layer may be provided between the ground or string selection line GSL or SSL and the channel structure and serve as a gate insulating layer of the ground or string selection transistor GST or SST. At least one of the gate insulation layers of the ground and string selection transistors GST and SST may be formed of the same material as the memory layer of the memory cell transistors MCT. However, in some exemplary embodiments, the at least one of the gate insulation layers of the ground and string selection transistors GST and SST may be formed of a gate dielectric material (e.g., a silicon oxides layer) commonly used in metal-oxide-semiconductor field effect transistors (MOSFETs).

The ground and string selection transistors GST and SST and the memory cell transistors MCT may be MOSFETs, in which the channel structures are used as channel regions. In other exemplary embodiments of the inventive concept, the channel structure, in conjunction with the ground selection line GSL, the word lines WL0-WL3, and the string selection lines SSL, may constitute metal-oxide-semiconductor (MOS) capacitors. In this case, if a voltage higher than a threshold voltage of the MOS capacitor is applied to the ground selection line GSL, the word lines WL0-WL3, and the string selection lines SSL, a fringe field may be produced to form an inversion layer between the word lines WL0 to WL3. The formation of the inversion layer may allow the ground selection transistor GST, the memory cell transistors MCT, and the string selection transistor SST to be electrically connected to each other.

Figure 2:
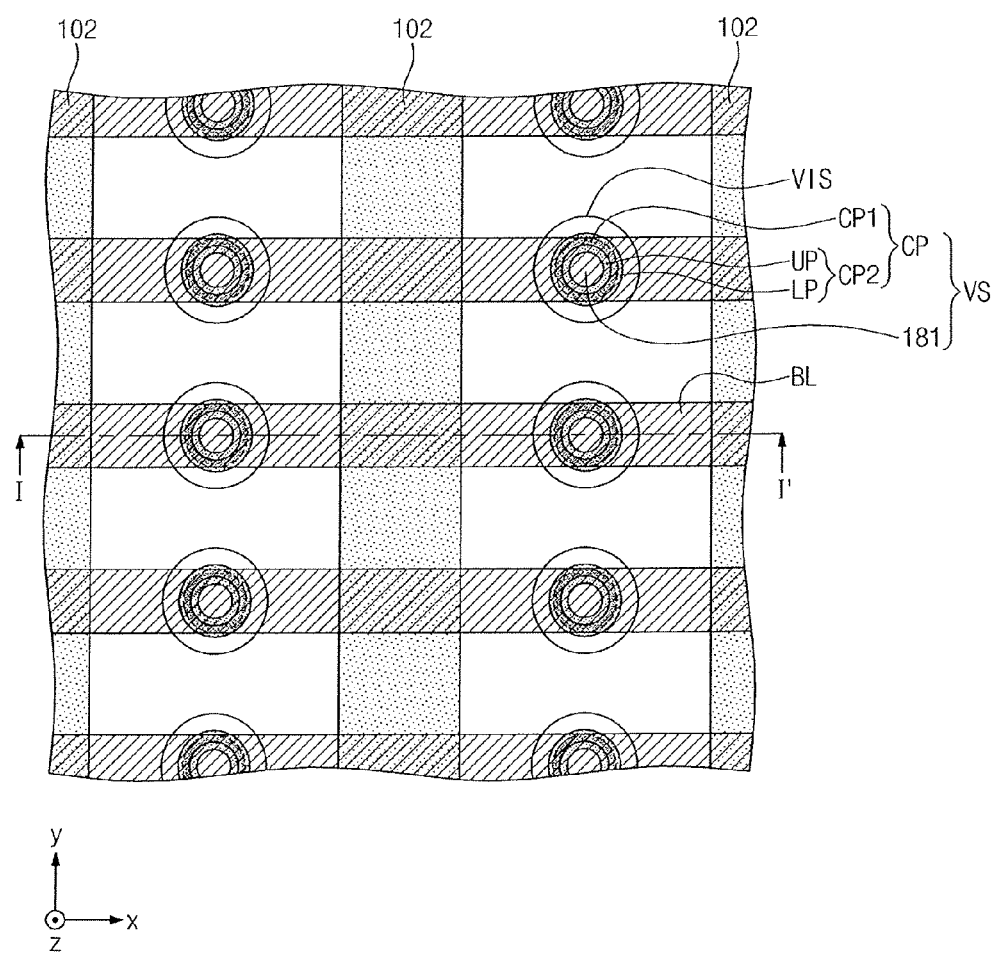
FIG. 2 is a plan view of a semiconductor memory device, according to an exemplary embodiment of the inventive concept.
Figure 3:
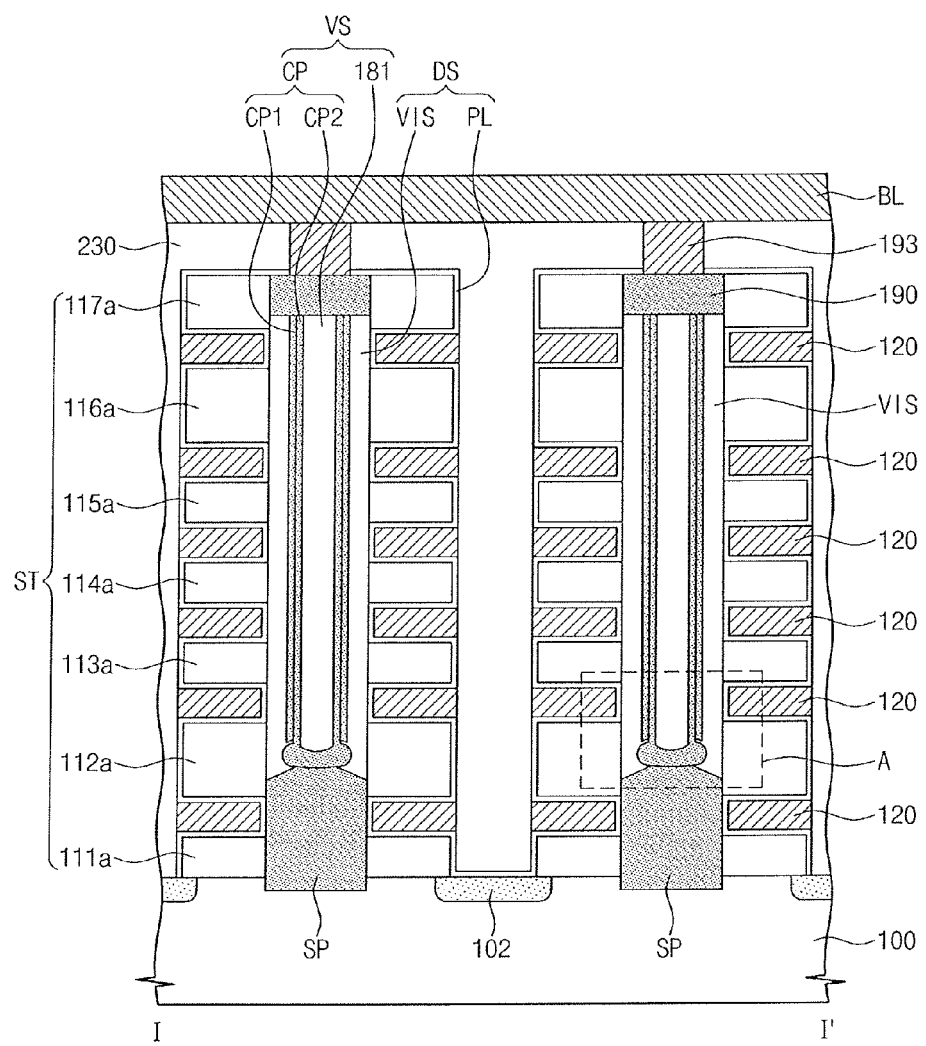
FIG. 3 is a sectional view taken along line I-I' of FIG. 2, illustrating a semiconductor memory device according to an exemplary embodiment of the inventive concept.
Figure 4A:
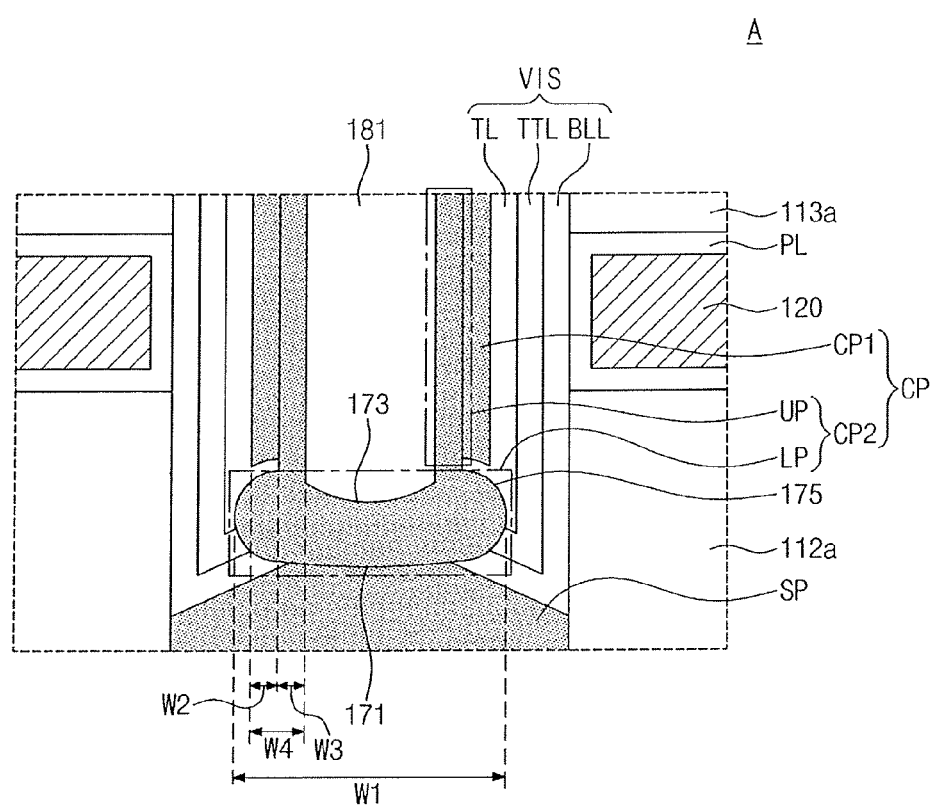
FIG. 4A is an enlarged view of a portion A of FIG. 3, according to an exemplary embodiment of the inventive concept.
Figure 4B:
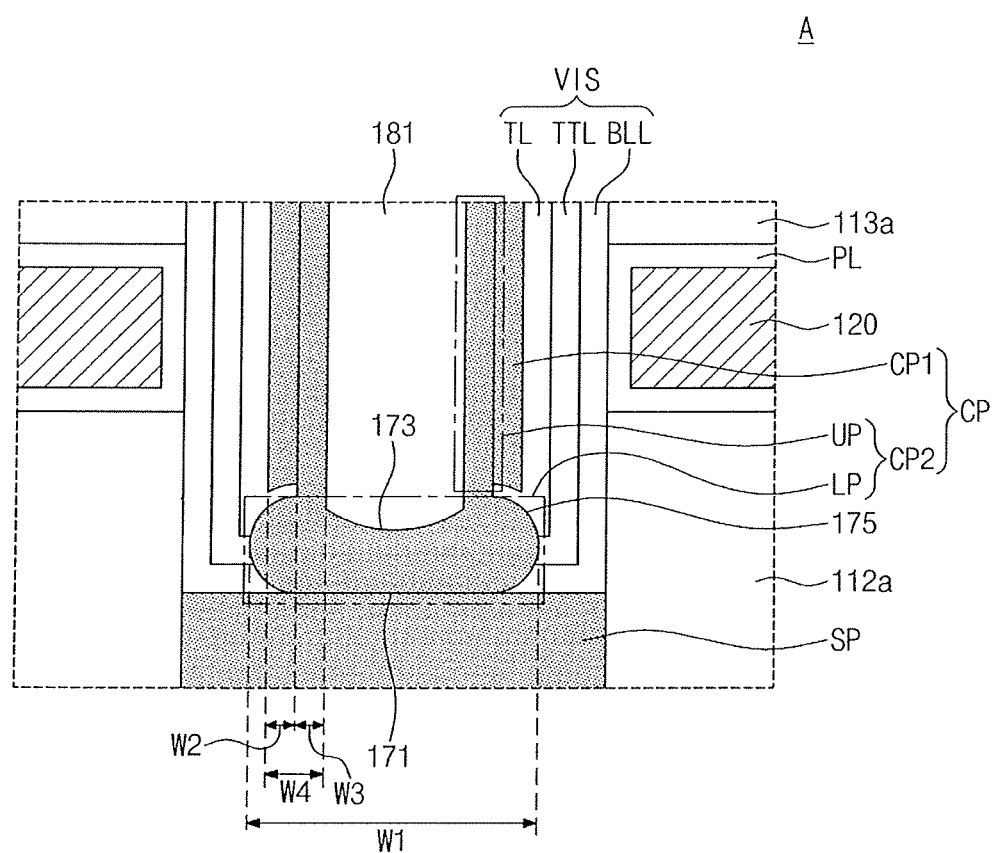
FIG. 4B is an enlarged view of a portion A of FIG. 3, according to an exemplary embodiment of the inventive concept.

FIG. 2 is a plan view of a semiconductor memory device, according to an exemplary embodiment of the inventive concept. FIG. 3 is a sectional view taken along line I-I' of FIG. 2, illustrating a semiconductor memory device according to an exemplary embodiment of the inventive concept. FIG. 4A is an enlarged view of a portion A of FIG. 3, according to an exemplary embodiment of the inventive concept. FIG. 4B is an enlarged view of a portion A of FIG. 3, according to an exemplary embodiment of the inventive concept.

Referring to FIGS. 2 and 3, a plurality of stacks ST may be provided on a substrate 100. The stacks ST may be arranged along a first direction X. The substrate 100 may be a silicon substrate, a silicon-germanium substrate, a germanium substrate, or a single-crystalline epitaxial layer grown on a single-crystalline silicon substrate. Impurity regions 102 may be provided in the substrate 100 and between the stacks ST. Each of the impurity regions 102 may extend in a second direction Y crossing the first direction X. The impurity regions 102 may serve as the common source line CSL. In this case, the impurity region 102 may have a different conductivity type from that of the substrate 100.

The stack ST may include insulating patterns 111a-117a stacked on the substrate 100 and gate electrodes 120 interposed between the insulating patterns 111a-117a. For example, the insulating patterns 111a-117a and the gate electrodes 120 may be alternately and repeatedly stacked on the substrate 100. The gate electrodes 120 may be stacked in a third direction Z perpendicular to a top surface of the substrate 100. The gate electrodes 120 sequentially stacked on the substrate 100 may serve as the ground selection line GSL, the word lines WL0-WL3, and the string selection line SSL in the order enumerated. For example, the bottommost (e.g., closest to the substrate 100) gate electrode 120 serves as the ground selection line GSL, the topmost gate electrode 120 serves as the string selection line SSL, and the gate electrodes 120 disposed between the topmost and bottommost gate electrodes 120 serve as the word lines WL0-WL3. The insulating patterns 111a-117a may have at least two different thicknesses varying depending on a type of the semiconductor memory device. For example, a lower insulating pattern 112a, which is interposed between the lowermost (e.g., bottommost) gate electrode 120 and the gate electrode 120 disposed above the lowermost gate electrode 120, and an upper insulating pattern 116a, which is interposed between the uppermost (e.g., topmost) gate electrode 120 and the gate electrode 120 disposed below the uppermost electrode 120, may be thicker than the other insulating patterns (e.g., the insulating patterns 111a, 113a, 114a, 115a, and 117a). The gate electrodes 120 may include a conductive material. For example, the gate electrodes 120 may include at least one of doped semiconductors (e.g., doped silicon, and the like), metals (e.g., tungsten, copper, aluminum, and the like), conductive metal nitrides (e.g., titanium nitride, tantalum nitride, and the like), or transition metals (e.g., titanium, tantalum, and the like). The insulating patterns 111a-117a may include, for example, a silicon oxide layer.

A lower channel SP may be provided on the top surface of the substrate 100 to penetrate a lower portion of the stack ST. The lower channel SP may have a top surface positioned at a higher level (e.g., a higher elevation) than that of the substrate 100. For example, the top surface of the lower channel SP may be positioned between a top surface of the lowermost gate electrode 120 and a bottom surface the gate electrode 120 disposed above the lowermost gate electrode 120. As shown in FIG. 4A, the top surface of the lower channel SP may be sectioned into an uppermost surface and top surfaces positioned at both sides of the uppermost surface. The lower channel SP may be provided in such a way that the top surfaces and the uppermost surface meet each other at a specific angle ranging from 90 degrees to 180 degrees. Alternatively, as shown in FIG. 4B, the lower channel SP may be provided to have a substantially flat top surface. The lower channel SP may include the same material and/or the same conductivity type as that of the substrate 100. For example, the lower channel SP may include an intrinsic semiconductor material or a p-type semiconductor material.

A plurality of channel structures VS may be provided to penetrate the stacks ST and be in contact with the lower channels SP, respectively. When viewed in a plan view, the channel structures VS may be arranged in a row along the first direction X. Alternatively, when viewed in a plan view, the channel structures VS may be disposed to form a zigzag arrangement in the first direction X. Each of the channel structures VS may include a vertical channel portion CP and a capping pattern 181. Furthermore, the vertical channel portion CP may include a first channel pattern CP1 and a second channel pattern CP2. The second channel pattern CP2 may be interposed between the first channel pattern CP1 and the capping pattern 181. For example, the first channel pattern CP1 may be provided in the form of a vertical wall and on an outer side surface of the second channel pattern CP2. The first channel pattern CP1 may be spaced apart from the lower channel SP. In certain cases, the lowermost surface of the second channel pattern CP2 may be in contact with the lower channel SP. The second channel pattern CP2 may include a portion shaped like a hollow pipe, a cylinder, or a cup. Alternatively, the second channel pattern CP2 may include a portion shaped like a circular pillar. The second channel pattern CP2 may have a closed bottom. In other words, the second channel pattern CP2 is a hollow round structure with a closed bottom that extends along the third direction Z. The capping pattern 181 may be provided in the second channel pattern CP2 and may be in contact with an inner surface of the second channel pattern CP2. The structure of the vertical channel portion CP will be described in more detail below.

Vertical insulating structures VIS may be provided to penetrate the stacks ST. When viewed in a plan view, each of the vertical insulating structures VIS may be provided to enclose an outer side surface of the corresponding channel structures VS. When viewed in a sectional view, each of the vertical insulating structures VIS may be provided on an outer side surface of the first channel pattern CP1 of the corresponding channel structures VS, in the form of a vertical wall, and may be interposed between the first channel pattern CP1 and the gate electrodes 120. The vertical insulating structure VIS may have a bottom portion that is in contact with a top surface of the lower channel SP and with at least a portion of the second channel pattern CP2. A horizontal insulating layer PL may be provided between the vertical insulating structure VIS and the gate electrodes 120. For example, the horizontal insulating layer PL may be provided on inner side surfaces of the gate electrodes 120. The horizontal insulating layer PL may extend to cover top and bottom surfaces of the gate electrodes 120. The vertical insulating structure VIS may include at least one of a silicon oxide layer, a silicon nitride layer, a silicon oxynitride layer, or high-k dielectric layers (e.g., metal oxide materials), and may have a single or multi-layered structure. The horizontal insulating layer PL may be formed of or include, for example, a silicon oxide layer. In an exemplary embodiment of the inventive concept, at least a portion of the vertical insulating structure VIS and at least a portion of the horizontal insulating layer PL may constitute a data-storing or memory layer DS.

Referring to FIGS. 4A and 4B, the vertical insulating structure VIS may include a blocking insulating layer BLL, a trap insulating layer TTL, and a tunnel insulating layer TL. The blocking insulating layer BLL may be disposed between the gate electrodes 120 and the trap insulating layer TTL. The trap insulating layer TTL may be disposed between the blocking insulating layer BLL and the tunnel insulating layer TL. The tunnel insulating layer TL may be disposed between the trap insulating layer TTL and the first channel pattern CP1. The lowermost surface of the blocking insulating layer BLL may be in contact with the top surface of the lower channel SP.

The second channel pattern CP2 may include a lower second channel pattern LP and an upper second channel pattern UP. The lower second channel pattern LP is a portion of the second channel pattern CP2 positioned below the first channel pattern CP1, and the upper second channel pattern UP is another portion of the second channel pattern CP2 positioned on the lower second channel pattern LP. A bottom surface 171 of the lower second channel pattern LP may be in contact with the uppermost surface and/or the top surface of the lower channel SP. A top surface 173 of the lower second channel pattern LP may be in contact with a bottom surface of the capping pattern 181. The top surface 173 of the lower second channel pattern LP may be positioned at a level that is lower than or coplanar with the bottom surface of the first channel pattern CP1, with respect to the substrate 100.

The lower second channel pattern LP may have a side surface 175 in contact with the vertical insulating structure VIS. The side surface 175 of the lower second channel pattern LP may be referred to as a protruding surface of the bottom region of the vertical channel portion VS or as an outer surface of the bottom region of the vertical channel portion VS that is extended toward an outer surface of the vertical insulating structure VIS and contacts the vertical insulating structure VIS. For example, the side surface 175 of the lower second channel pattern LP may be in contact with the blocking insulating layer BLL, the trap insulating layer TTL, and the tunnel insulating layer TL. A portion of the side surface 175 of the lower second channel pattern LP may be in contact with the bottom surface of the first channel pattern CP1. The side surface 175 of the lower second channel pattern LP may have a curved profile. For example, the side surface 175 of the lower second channel pattern LP may have a curved surface protruding toward the vertical insulating structure VIS. Thus, the vertical insulating structure VIS has a smaller width between the stack ST and a bottom region of the vertical channel portion VS than between the stack ST and a top region of the vertical channel portion VS. In other words the thickness of the vertical insulating structure VIS is smaller between the stack ST and the side surface 175 of the lower second channel pattern LP than between the stack ST and the upper second channel pattern UP. The lower second channel pattern LP may be provided in such a way that the side surface 175 is not expanded beyond a vertical interface between the tunnel insulating layer TL and the trap insulating layer TTL. The upper second channel pattern UP may be provided to cover a side surface (e.g., an inner surface) of the first channel pattern CP1 and thereby have a vertical side profile. The bottom surface of the first channel pattern CP1 may be spaced apart from the lower second channel pattern LP. The vertical insulating structure VIS may be interposed between the bottom surface of the first channel pattern CP1 and the lower second channel pattern LP. For example, a portion of the tunnel insulating layer TL may be interposed between the bottom surface of the first channel pattern CP1 and the lower second channel pattern LP.

The lower second channel pattern LP may have a width W1 that is larger than a sum W4 of a width W2 of the first channel pattern CP1 and a width W3 of the upper second channel pattern UP (e.g., W1>W4=W2+W3).

To control a threshold voltage property of memory cells, a thickness of a channel pattern adjacent to the memory cells may need to be reduced. However, a reduction in thickness of the channel pattern may lead to a weak coupling between a ground selection transistor and the channel pattern. In addition, the channel pattern may be partially disconnected near the ground selection transistor, causing an increase in threshold voltage of the memory cells and a decreased reliability of the semiconductor memory device.

According to an exemplary embodiment of the inventive concept, the channel pattern is locally thickened at a position adjacent to the ground selection transistor. Accordingly, the reliability of the semiconductor memory device is increased.

Referring back to FIG. 3, conductive pads 190 may be provided on the vertical insulating structures VIS and the channel structures VS. In an exemplary embodiment of the inventive concept, the conductive pad 190 may be formed to have a conductivity type different from that of the substrate 100. For example, the conductive pad 190 may be doped with n-type impurities. Each of the conductive pads 190 may serve as a drain electrode of the cell string CSTR. An interlayered insulating layer 230 may be formed on the substrate 100 to cover the stacks ST. The interlayered insulating layer 230 may include an insulating material (e.g., at least one of silicon oxide, silicon nitride, or silicon oxynitride).

Contact plugs 193 may be provided to penetrate the interlayered insulating layer 230 and may be connected to the conductive pads 190, respectively. The contact plugs 193 may include at least one of doped silicon or metallic materials. Bit lines BL may be provided on the interlayered insulating layer 230. The bit lines BL may be disposed to extend in the first direction X and cross (e.g., overlap) the stacks ST. Each of the bit lines BL may be electrically connected to a plurality of the vertical channel portions CP via the conductive pads 190. The bit lines BL may be formed of or include a conductive material.

Figure 5:
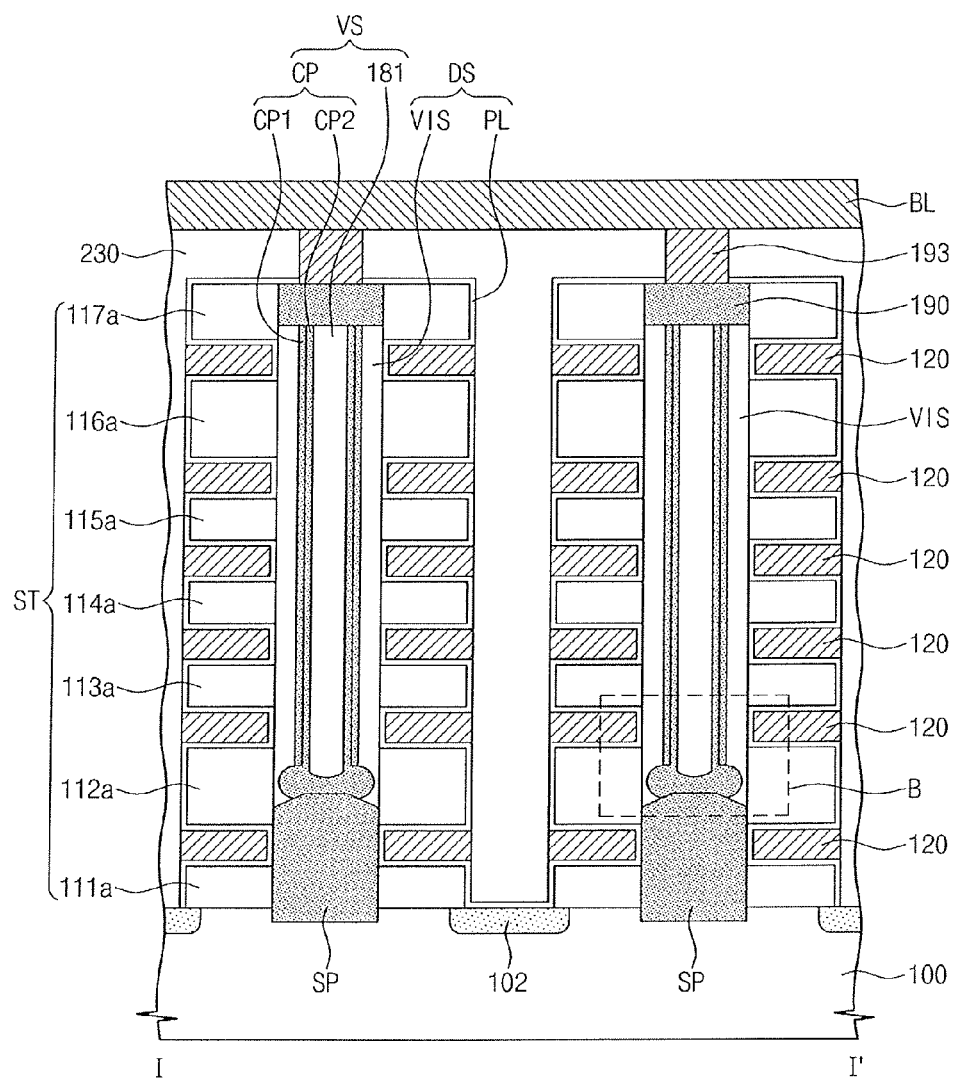
FIG. 5 is a sectional view taken along line I-I' of FIG. 2, illustrating a semiconductor memory device according to an exemplary embodiment of the inventive concept.
Figure 6:
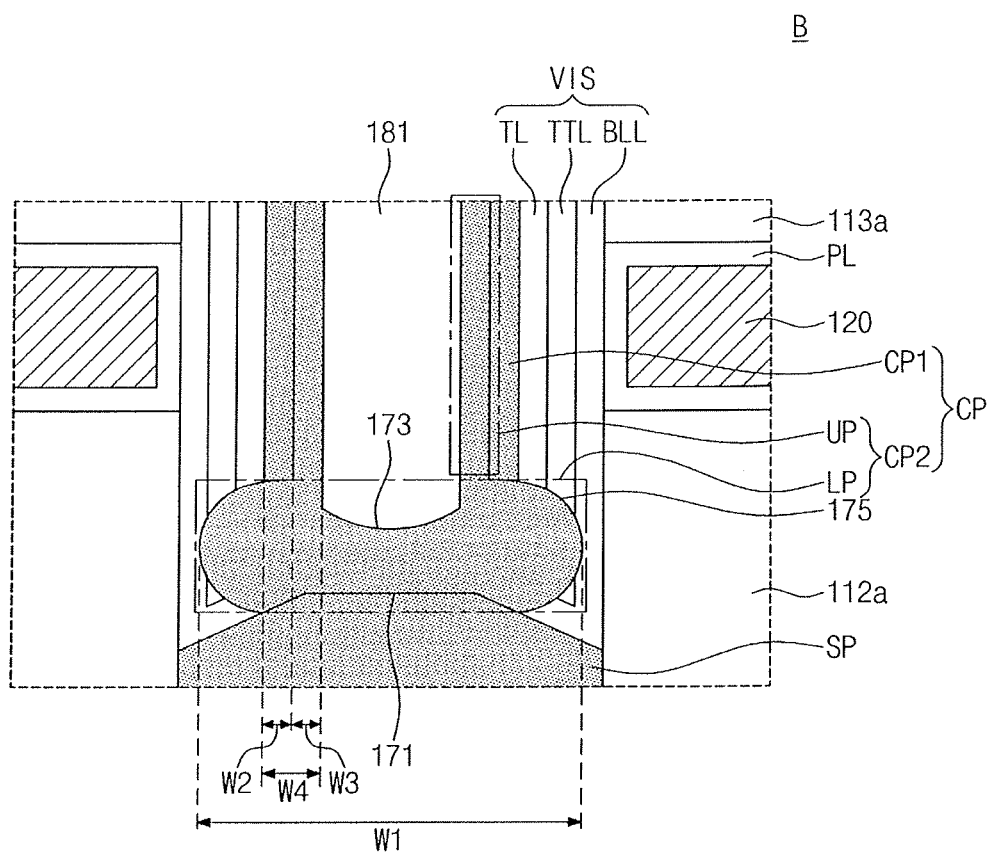
FIG. 6 is an enlarged view of a portion B of FIG. 5, according to an exemplary embodiment of the inventive concept.

FIG. 5 is a sectional view taken along line I-I' of FIG. 2, illustrating a semiconductor memory device according to an exemplary embodiment of the inventive concept. FIG. 6 is an enlarged view of a portion B of FIG. 5, according to an exemplary embodiment of the inventive concept. A duplicate description of elements and features described above may be omitted for brevity.

Referring to FIGS. 5 and 6, the bottom surface 171 of the lower second channel pattern LP may be in contact with the uppermost surface of the lower channel SP. The top surface 173 of the lower second channel pattern LP may be in contact with the bottom surface of the capping pattern 181. The top surface 173 of the lower second channel pattern LP may be positioned at a level that is lower than or coplanar with the bottom surface of the first channel pattern CP1, with respect to the substrate 100.

The lower second channel pattern LP may have a side surface 175 in contact with the vertical insulating structure VIS. For example, the side surface 175 of the lower second channel pattern LP may be in contact with the blocking insulating layer BLL, the trap insulating layer TTL, and the tunnel insulating layer TL. A portion of the side surface 175 of the lower second channel pattern LP may be in contact with the bottom surface of the first channel pattern CP1. The side surface 175 of the lower second channel pattern LP may have a curved profile. For example, the side surface 175 of the lower second channel pattern LP may have a curved surface protruding toward the vertical insulating structure VIS. The lower second channel pattern LP may be provided in such a way that the side surface 175 is not expanded (e.g., protruded) beyond a vertical interface between the lower insulating pattern 112a and the blocking insulating layer BLL. The upper second channel pattern UP may be provided to cover a side surface (e.g., the inner surface) of the first channel pattern CP1 and may have a vertical side profile.

The lower second channel pattern LP may have a width W1 that is larger than a sum W4 of the width W2 of the first channel pattern CP1 and the width W3 of the upper second channel pattern UP (e.g., W1>W4=W2+W3).

Figure 7:
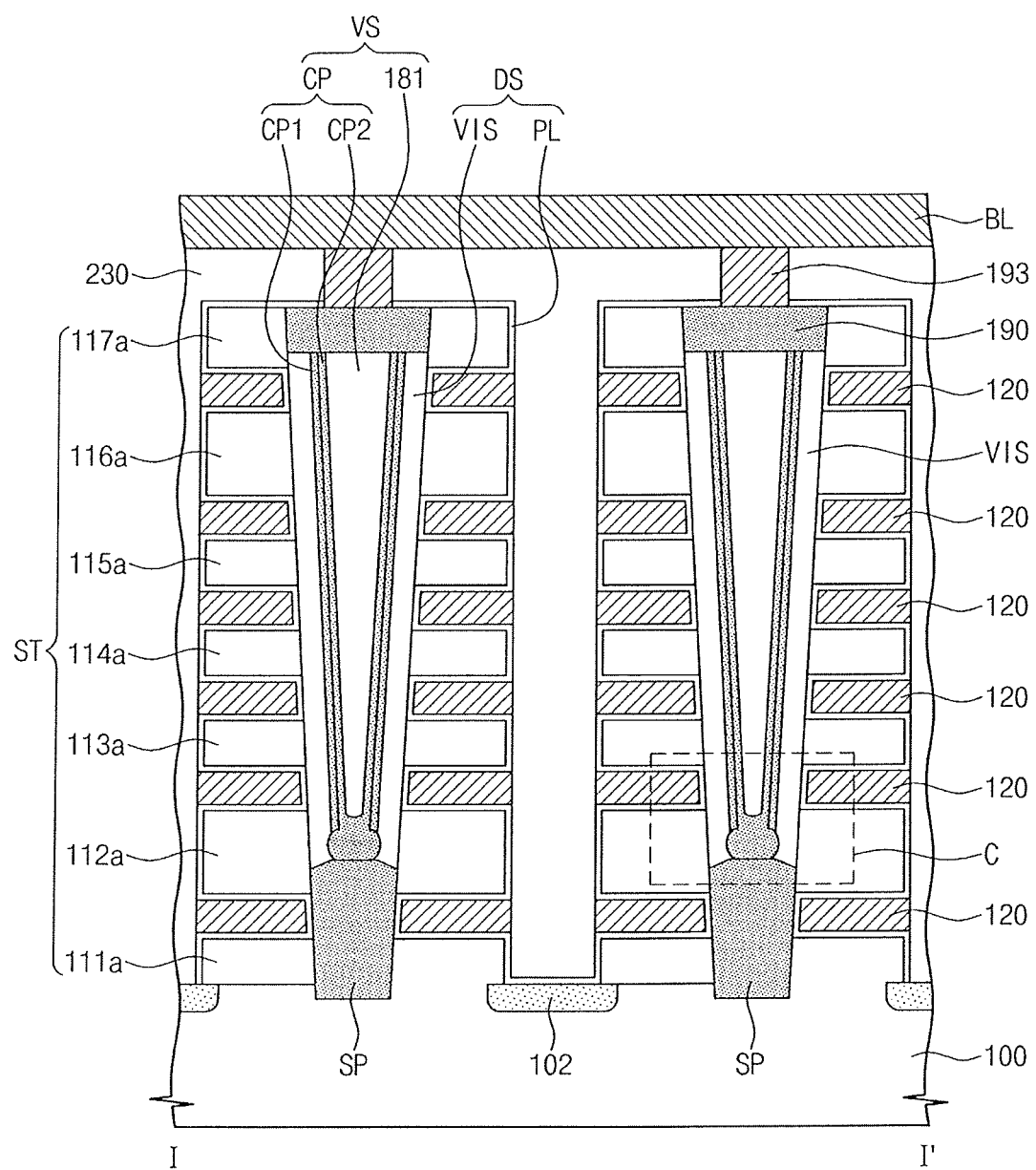
FIG. 7 is a sectional view taken along line I-I' of FIG. 2, illustrating a semiconductor memory device according to an exemplary embodiment of the inventive concept.
Figure 8:
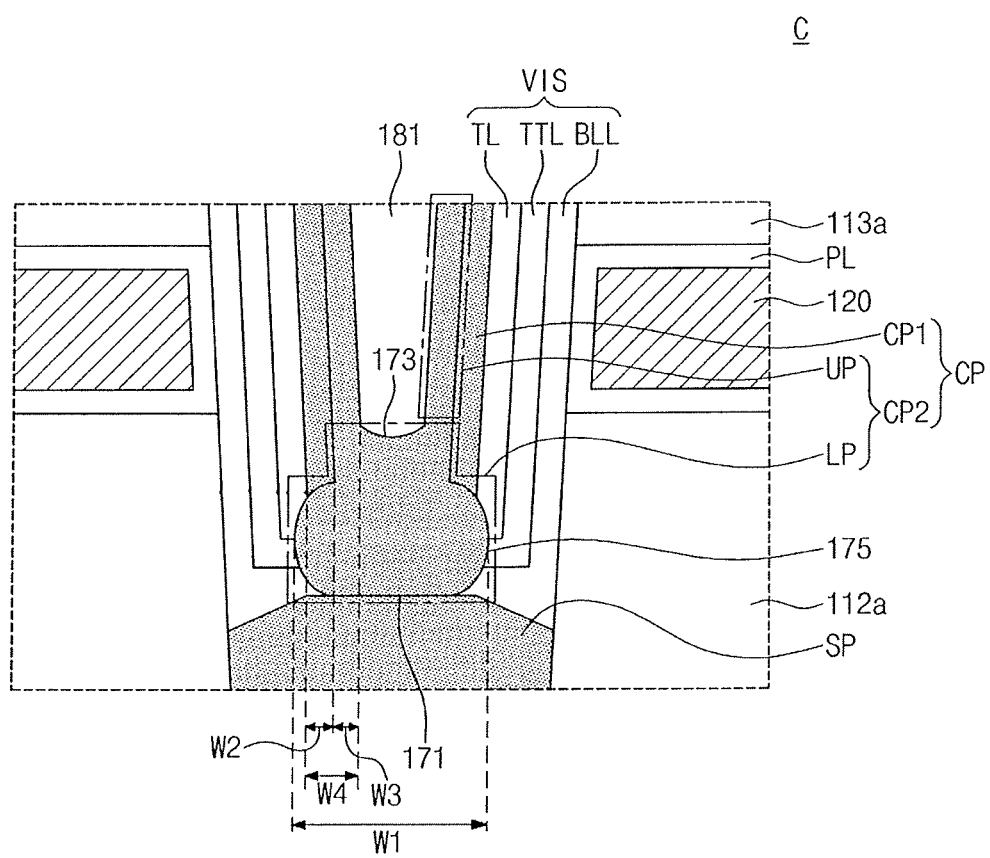
FIG. 8 is an enlarged view of a portion C of FIG. 7, according to an exemplary embodiment of the inventive concept.

FIG. 7 is a sectional view taken along line I-I' of FIG. 2, illustrating a semiconductor memory device according to an exemplary embodiment of the inventive concept. FIG. 8 is an enlarged view of a portion C of FIG. 7, according to an exemplary embodiment of the inventive concept. A duplicate description of elements and features described above may be omitted for brevity.

Referring to FIGS. 7 and 8, the vertical insulating structure VIS and the channel structure VS may be provided to have inclined side surfaces. According to an exemplary embodiment of the inventive concept, the vertical insulating structure VIS and the channel structure VS have inclined surfaces. The capping pattern 181 may have a width varying depending on the distance from the lower channel SP. For example, the bottom surface of the capping pattern 181 may be narrower than the top surface of the capping pattern 181. The bottom surface of the capping pattern 181 is closer to the lower channel SP than the top surface of the capping pattern 181.

The bottom surface 171 of the lower second channel pattern LP may be in contact with the uppermost surface of the lower channel SP. The top surface 173 of the lower second channel pattern LP may be in contact with the bottom surface of the capping pattern 181. The top surface 173 of the lower second channel pattern LP may be positioned at a higher level than the bottom surface of the first channel pattern CP1, with respect to the substrate 100. The side surface 175 of the lower second channel pattern LP may be in contact with the vertical insulating structure VIS. The side surface 175 of the lower second channel pattern LP may be in contact with the blocking insulating layer BLL, the trap insulating layer TTL, and the tunnel insulating layer TL. The lower second channel pattern LP may include a portion in contact with the bottom surface of the first channel pattern CP1. In other words, the bottom surface of the first channel pattern CP1 contacts the lower second channel pattern LP. The side surface 175 of the lower second channel pattern LP may have a curved profile. The side surface 175 of the lower second channel pattern LP may have a curved surface protruding toward the vertical insulating structure VIS. The upper second channel pattern UP may be provided to cover a side surface (e.g., the inner surface) of the first channel pattern CP1 and thereby have a vertical side profile.

The lower second channel pattern LP may have a width W1 that is larger than a sum W4 of a width W2 of the first channel pattern CP1 and a width W3 of the upper second channel pattern UP (e.g., W1>W4=W2+W3).

Figure 9:
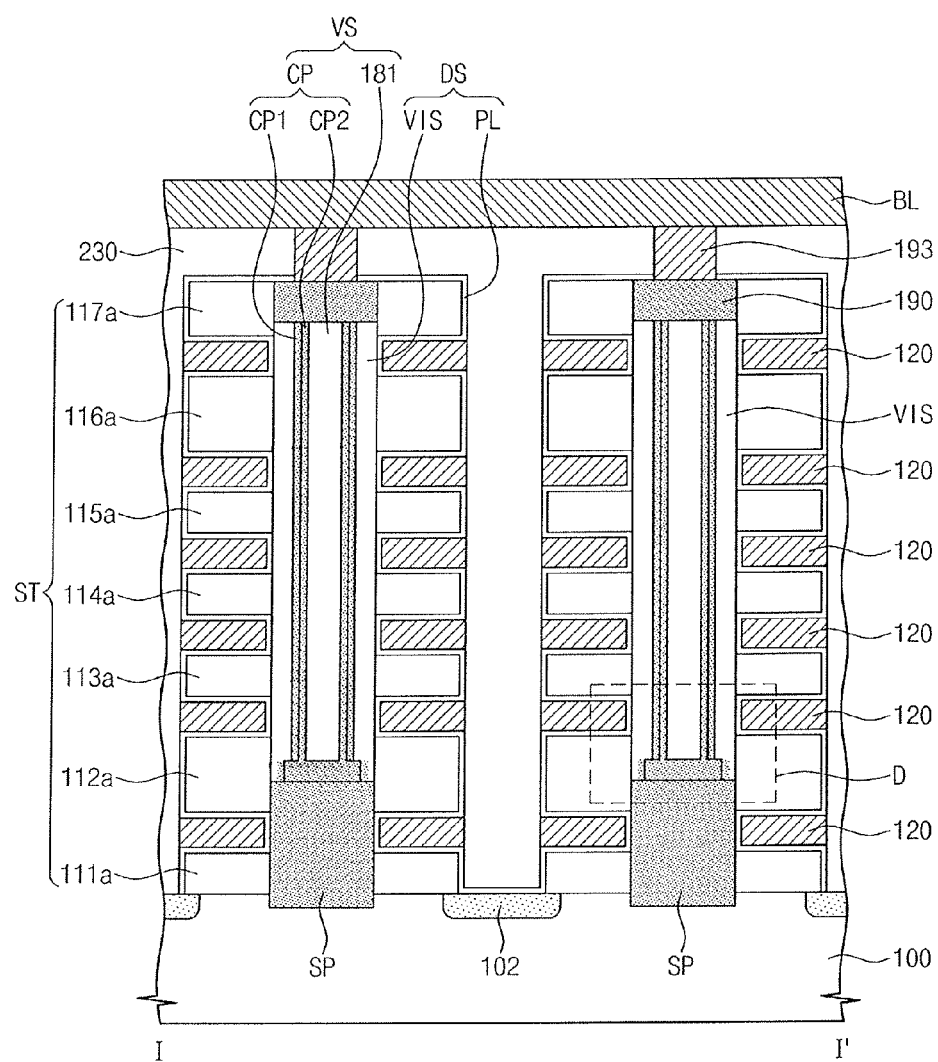
FIG. 9 is a sectional view taken along line I-I' of FIG. 2, illustrating a semiconductor memory device according to an exemplary embodiment of the inventive concept.
Figure 10A:
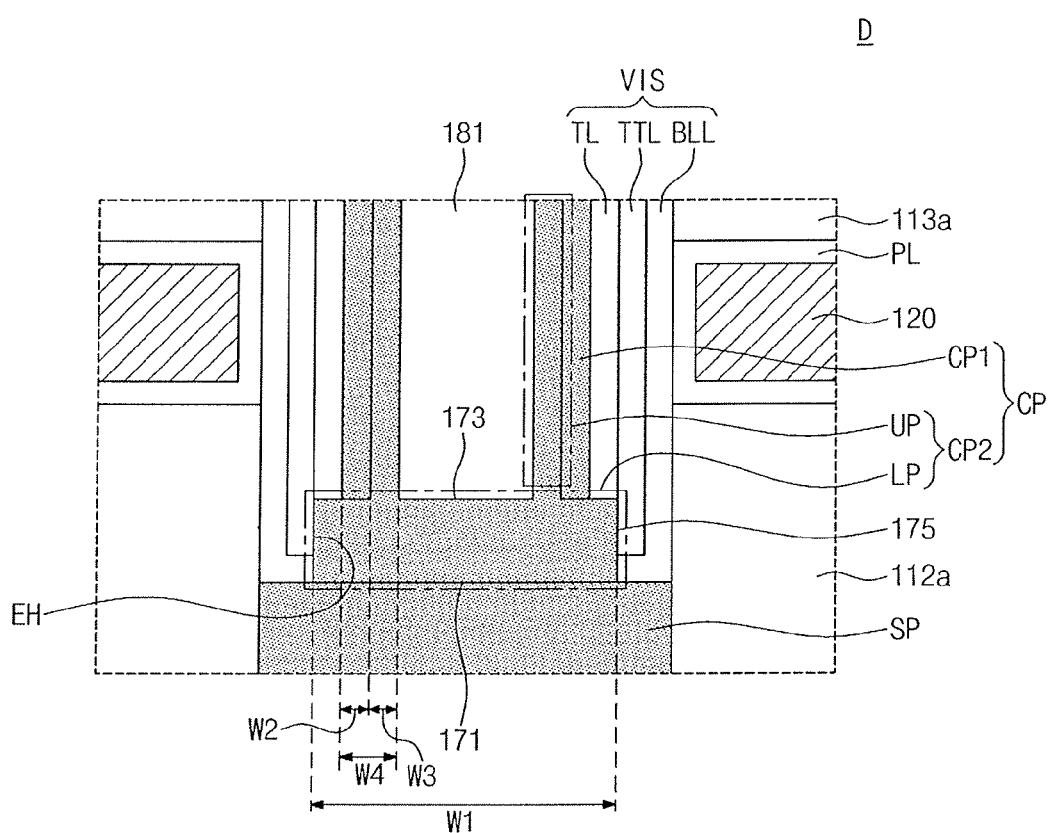
FIG. 10A is an enlarged view of a portion D of FIG. 9, according to an exemplary embodiment of the inventive concept.
Figure 10B:
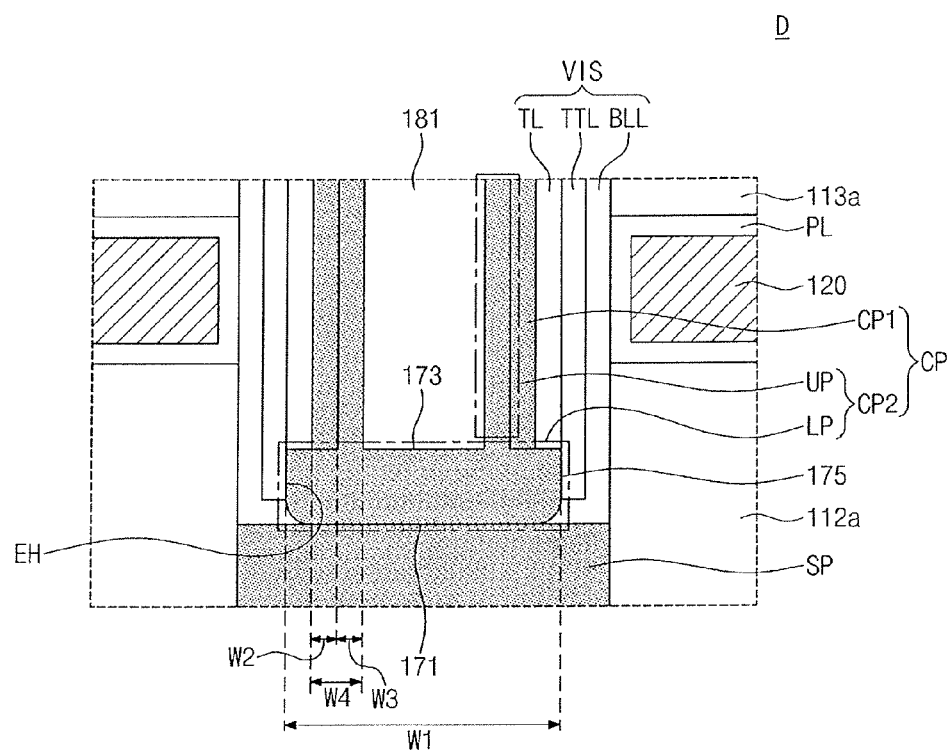
FIG. 10B is an enlarged view of the portion D of FIG. 9, according to an exemplary embodiment of the inventive concept.

FIG. 9 is a sectional view taken along line I-I' of FIG. 2, illustrating a semiconductor memory device according to an exemplary embodiment of the inventive concept. FIG. 10A is an enlarged view of a portion D of FIG. 9, according to an exemplary embodiment of the inventive concept. FIG. 10B is an enlarged view of the portion D of FIG. 9, according to an exemplary embodiment of the inventive concept. A duplicate description of elements and features described above may be omitted for brevity.

Referring to FIGS. 9, 10A, and 10B, the lower channel SP may have a flat top surface. The bottom surface of the vertical insulating structure VIS may have a portion in contact with the top surface of the lower channel SP and another portion spaced apart from the top surface of the lower channel SP (e.g., the other portion of the bottom surface of the vertical insulating structure VIS does not contact the top surface of the lower channel SP). The bottom surface of the blocking insulating layer BLL may be in contact with the top surface of the lower channel SP. Accordingly, the bottom surface of the blocking insulating layer BLL may be positioned at the same level as that of the top surface of the lower channel SP. The bottom surface of the trap insulating layer TTL may be in contact with the top surface of the blocking insulating layer BLL, and the bottom surface of the tunnel insulating layer TL may be spaced apart from the top surface of the lower channel SP. Accordingly, the blocking insulating layer BLL and a portion of a side surface of the trap insulating layer TTL may be exposed by the tunnel insulating layer TL.

As shown in FIG. 10A, the portion of the side surface of the blocking insulating layer BLL exposed by the tunnel insulating layer TL may be vertically aligned (e.g., located along the same horizontal position) with the portion of the side surface of the trap insulating layer TTL exposed by the tunnel insulating layer TL. In other words, the portion of the side surface of the blocking insulating layer BLL exposed by the tunnel insulating layer TL may be disposed along the same vertical line on which the portion of the side surface of the trap insulating layer TTL exposed by the tunnel insulating layer TL is disposed. In addition, the portion of the side surface of the blocking insulating layer BLL exposed by the tunnel insulating layer TL may be adjacent to the side surface of the trap insulating layer TTL exposed by the tunnel insulating layer TL. Alternatively, as shown in FIG. 10B, the portion of the side surface of the blocking insulating layer BLL exposed by the tunnel insulating layer TL may be located at a different horizontal position from that of the portion of the side surface of the trap insulating layer TTL exposed by the tunnel insulating layer TL. For example, the portion of the side surface of the blocking insulating layer BLL exposed by the tunnel insulating layer TL may have a concavely curved profile, and the portion of the side surface of the trap insulating layer TTL exposed by the tunnel insulating layer TL may have a vertical side profile.

The upper second channel pattern UP may be formed to conformally cover a side surface of the first channel pattern CP1 (e.g., the inner side surface of the first channel pattern CP1). The lower second channel pattern LP may cover the bottom surface of the first channel pattern CP1, the bottom surface of the tunnel insulating layer TL, the portion of the side surface of the trap insulating layer TTL exposed by the tunnel insulating layer TL, the portion of the side surface of the blocking insulating layer BLL exposed by the tunnel insulating layer TL, and the top surface of the lower channel SP. In an exemplary embodiment of the inventive concept, the lower second channel pattern LP covers a portion of the top surface of the lower channel SP. Accordingly, the bottom surface 171 of the lower second channel pattern LP may be in contact with the top surface of the lower channel SP, and the side surface 175 of the lower second channel pattern LP may be in contact with the portion of the side surface of the trap insulating layer TTL exposed by the tunnel insulating layer TL and the portion of the side surface of the blocking insulating layer BLL exposed by the tunnel insulating layer TL. The top surface 173 of the lower second channel pattern LP may be in contact with the bottom surface of the capping pattern 181.

Referring to FIG. 10A, the bottom and side surfaces 171 and 175 of the lower second channel pattern LP may form an angulated profile. For example, the bottom and side surfaces 171 and 175 may meet each other at a substantially right angle, thereby forming a 90 degree corner. Alternatively, referring to FIG. 10B, the bottom and side surfaces 171 and 175 of the lower second channel pattern LP may meet each other to form a rounded or curved profile.

Referring back to FIGS. 9, 10A, and 10B, the lower second channel pattern LP may have a width W1 that is larger than a sum W4 of the width W2 of the first channel pattern CP1 and the width W3 of the upper second channel pattern UP (e.g., W1>W4=W2+W3).

Figure 11:
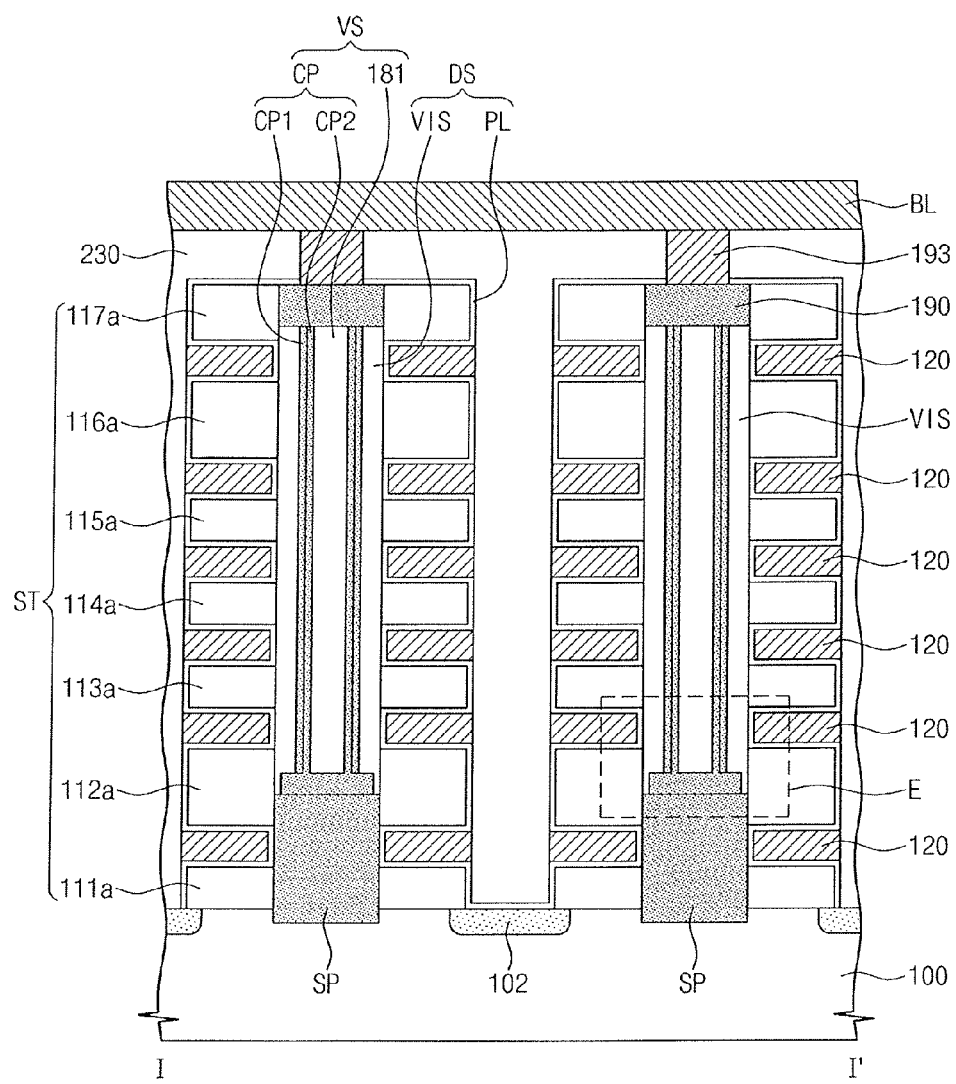
FIG. 11 is a sectional view taken along line I-I' of FIG. 2, illustrating a semiconductor memory device according to an exemplary embodiment of the inventive concept.
Figure 12A:
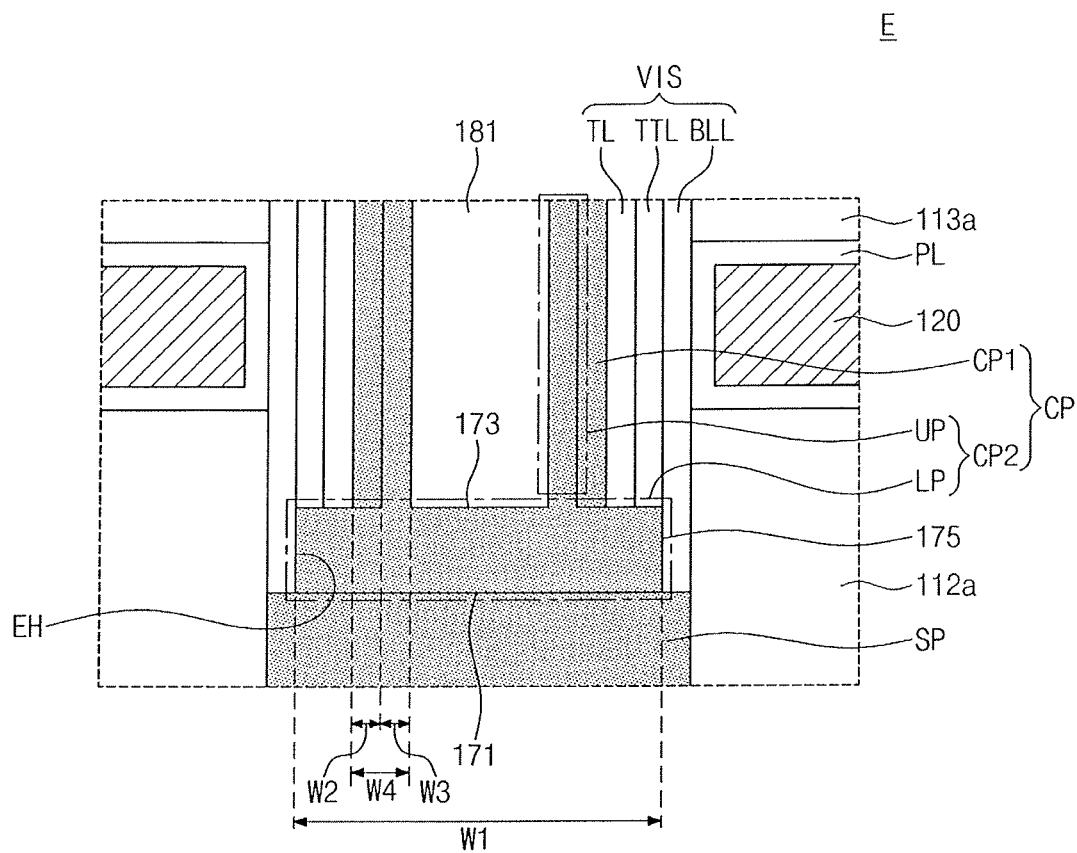
FIG. 12A is an enlarged view of a portion E of FIG. 11, according to an exemplary embodiment of the inventive concept.
Figure 12B:
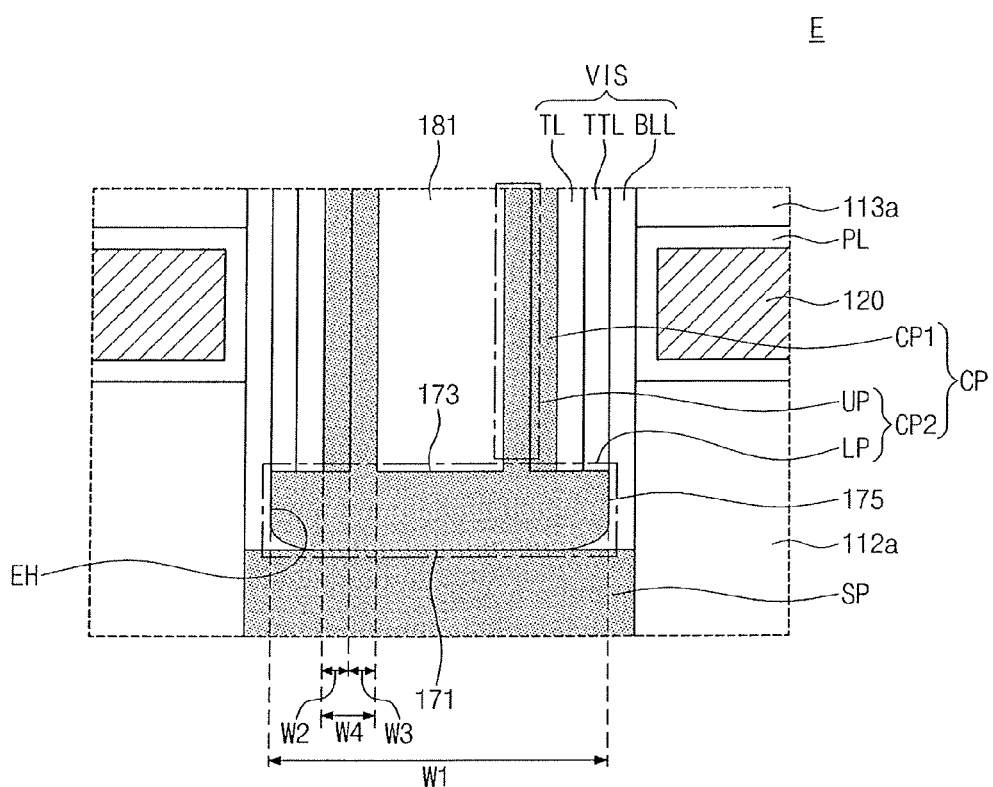
FIG. 12B is an enlarged view of the portion E of FIG. 11, according to an exemplary embodiment of the inventive concept.

FIG. 11 is a sectional view taken along line I-I' of FIG. 2, illustrating a semiconductor memory device according to an exemplary embodiment of the inventive concept. FIG. 12A is an enlarged view of a portion E of FIG. 11, according to an exemplary embodiment of the inventive concept. FIG. 12B is an enlarged view of the portion E of FIG. 11, according to an exemplary embodiment of the inventive concept. A duplicate description of elements and features described above may be omitted for brevity.

Referring to FIGS. 11, 12A, and 12B, the top surface of the lower channel SP may be flat. The bottom surface of the blocking insulating layer BLL may be in contact with the top surface of the lower channel SP. The bottom surfaces of the trap insulating layer TTL and the tunnel insulating layer TL may be vertically spaced apart from the top surface of the lower channel SP. The bottom surfaces of the trap insulating layer TTL and the tunnel insulating layer TL may be positioned at the same level (e.g., at the same height with respect to the substrate 100). Accordingly, a portion of a side surface of the blocking insulating layer BLL may be exposed by the tunnel insulating layer TL and the trap insulating layer TTL.

As shown in FIG. 12A, the portion of the side surface of the blocking insulating layer BLL exposed by the tunnel insulating layer TL and the trap insulating layer TTL may have a vertical side profile. Alternatively, the portion of the side surface of the blocking insulating layer BLL exposed by the trap insulating layer TTL may have a concavely curved profile.

Referring back to FIGS. 11, 12A, and 12B, the upper second channel pattern UP may be formed to conformally cover a side surface of the first channel pattern CP1 (e.g., the inner side surface of the first channel pattern CP1). The lower second channel pattern LP may cover the bottom surface of the first channel pattern CP1, the bottom surfaces of the tunnel insulating layer TL and the trap insulating layer TTL, a portion of the side surface of the blocking insulating layer BLL exposed by the tunnel insulating layer TL and the trap insulating layer TTL, and the top surface of the lower channel SP. In an exemplary embodiment of the inventive concept, the lower second channel pattern LP covers a portion of the top surface of the lower channel SP. Accordingly, the bottom surface 171 of the lower second channel pattern LP may be in contact with the top surface of the lower channel SP, and the side surface 175 of the lower second channel pattern LP may be in contact with the portion of the side surface of the blocking insulating layer BLL exposed by the tunnel insulating layer TL and the trap insulating layer TTL. The top surface 173 of the lower second channel pattern LP may be in contact with the bottom surface of the capping pattern 181.

Referring to FIG. 12A, the bottom and side surfaces 171 and 175 of the lower second channel pattern LP may form an angulated profile. For example, the bottom and side surfaces 171 and 175 may meet each other at a substantially right angle, thereby forming a 90 degree corner. Alternatively, referring to FIG. 12B, the bottom and side surfaces 171 and 175 of the lower second channel pattern LP may meet each other to form a rounded or curved profile.

Referring to FIGS. 11, 12A, and 12B, the lower second channel pattern LP may have a width W1 that is larger than a sum W4 of the width W2 of the first channel pattern CP1 and the width W3 of the upper second channel pattern UP (e.g., W1>W4=W2+W3).

FIGS. 13, 14, 15, 16, 18, 20, 22, 24, 25, 26 and 27 are sectional views illustrating a method of fabricating a semiconductor memory device, according to an exemplary embodiment of the inventive concept. FIGS. 17, 19, 21 and 23 are enlarged views of the portion A of FIG. 16, according to exemplary embodiments of the inventive concept.

Figure 13:
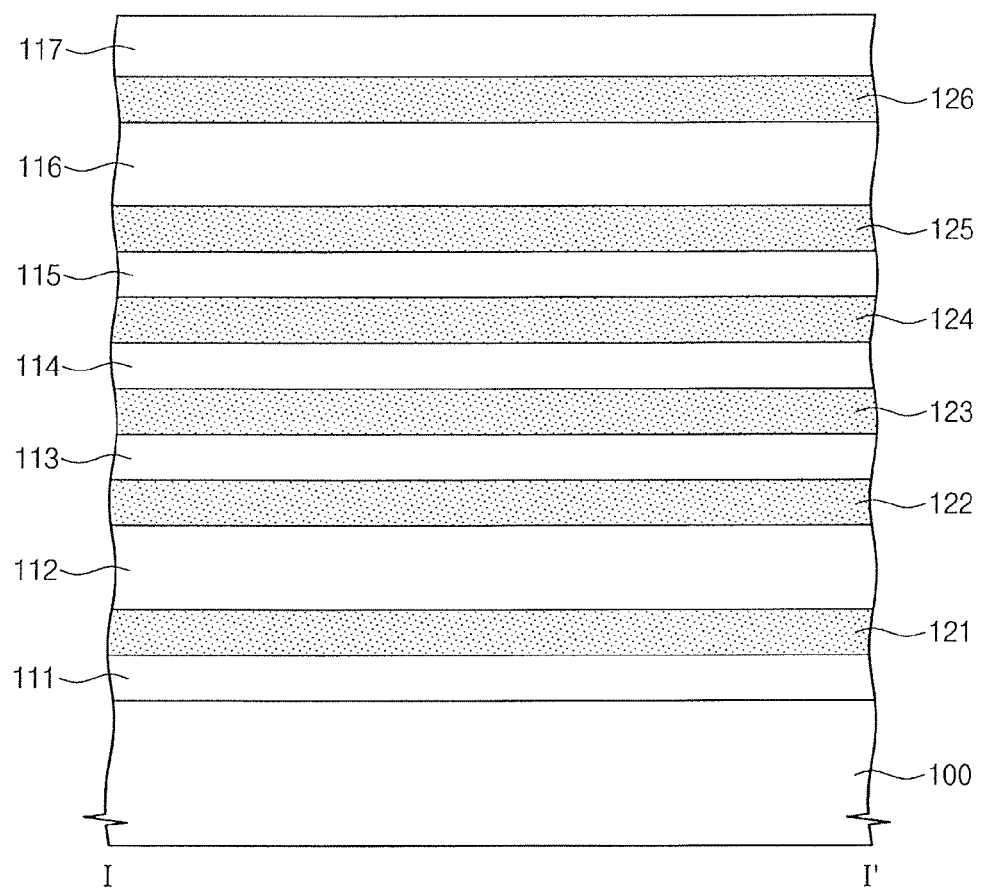
FIGS. 13, 14, 15, 16, 18, 20, 22, 24, 25, 26 and 27 are sectional views illustrating a method of fabricating a semiconductor memory device, according to an exemplary embodiment of the inventive concept.

Referring to FIG. 13, a mold structure may be formed on the substrate 100.

The substrate 100 may be a silicon substrate, a silicon-germanium substrate, a germanium substrate, or a single-crystalline epitaxial layer grown on a single-crystalline silicon substrate.

The mold structure may include insulating layers 111, 112, 113, 114, 115, 116, and 117, and sacrificial layers 121, 122, 123, 124, 125, and 126. The insulating layers 111-117 and the sacrificial layers 121-126 may be alternately and repeatedly stacked on the substrate 100. The insulating layers 111-117 may include a material capable of having a lower etch rate than that of the sacrificial layers 121-126, in a subsequent etching process for removing the sacrificial layers 121-126. For example, in the case where the insulating layers 111-117 are formed of silicon oxide, the sacrificial layers 121-126 may be formed of silicon nitride or silicon oxynitride. The insulating layers 111-117 may be formed of the same material, and the sacrificial layers 121-126 may be formed of the same material. A buffer insulating layer may be provided between the substrate 100 and the mold structure.

Figure 14:
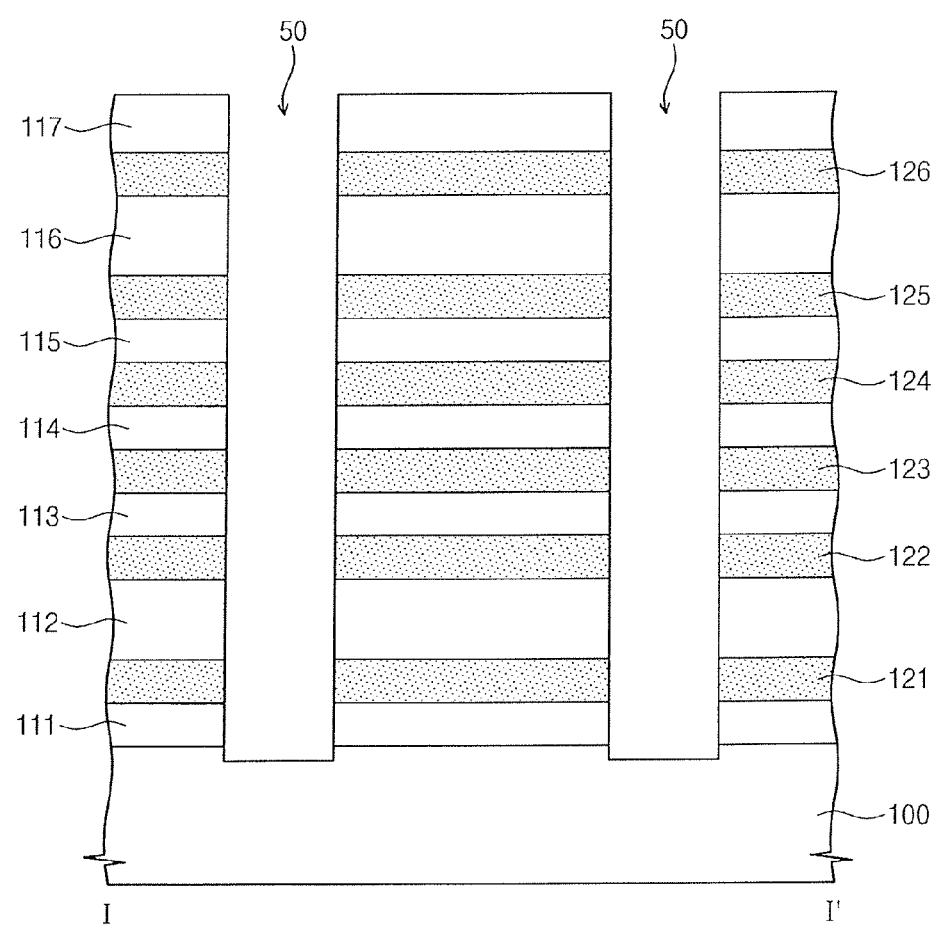

Referring to FIG. 14, the mold structure may be etched to form an opening 50. A mask pattern may be formed on the uppermost insulating layer 117, and the mold structure may be anisotropically etched using the mask pattern as an etch mask. As a result of the anisotropic etching process, the opening 50 may have a constant width, independent of a distance from the substrate 100. Alternatively, as shown in FIG. 7, the opening 50 may be formed to have a width varying depending on the distance from the substrate 100. For example, the opening 50 may be formed to have a side surface inclined with respect to the substrate 100. The etching process may be performed in an over-etch manner, and thus, the top surface of the substrate 100 may be partially recessed. When viewed in a plan view, the opening 50 may have a circular, elliptical, or polygonal shape.

Figure 15:
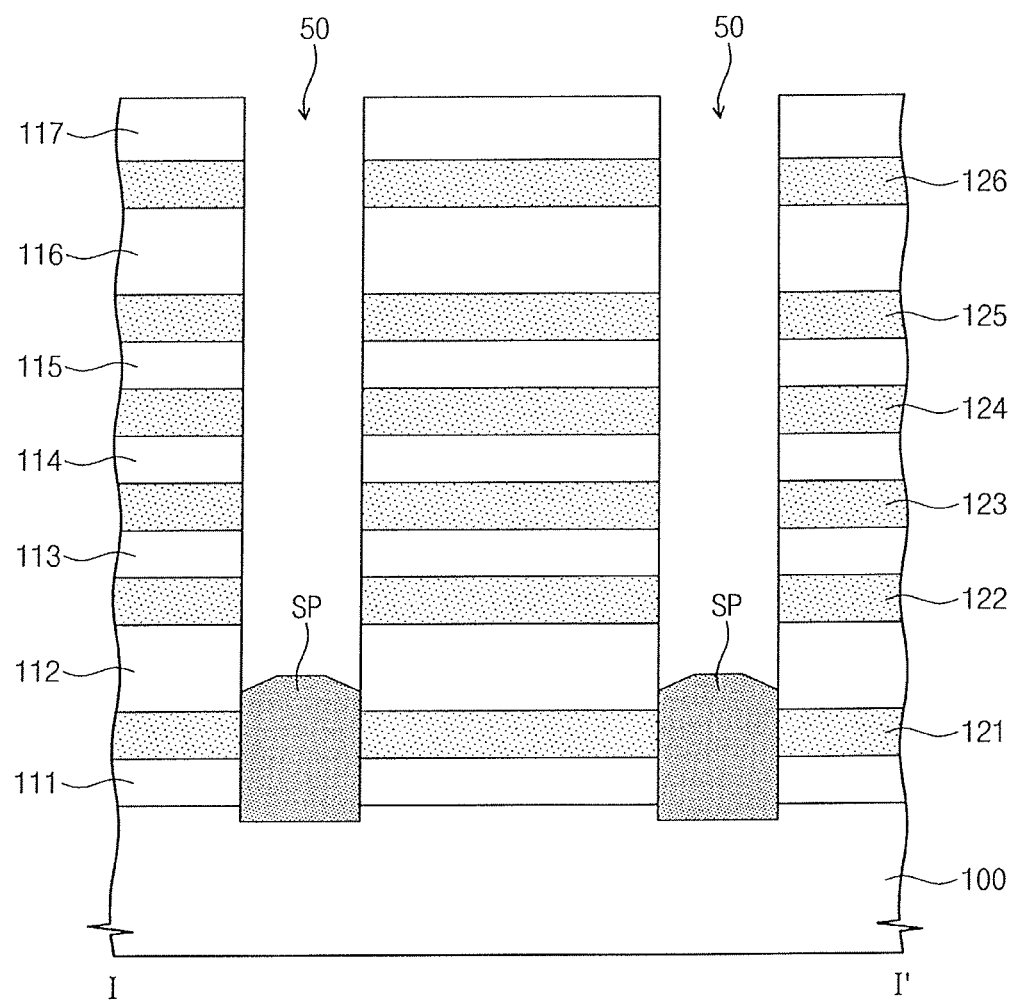

Referring to FIG. 15, the lower channel SP may be formed on the top surface of the substrate 100 exposed by the opening 50. For example, the lower channel SP may be grown from the substrate 100 by a selective epitaxial growth process, in which the substrate 100 exposed by the opening 50 is used as a seed layer. The lower channel SP may have the same conductivity type as the substrate 100. The lower channel SP may be an intrinsic semiconductor material or a p-type semiconductor material.

Figure 16:
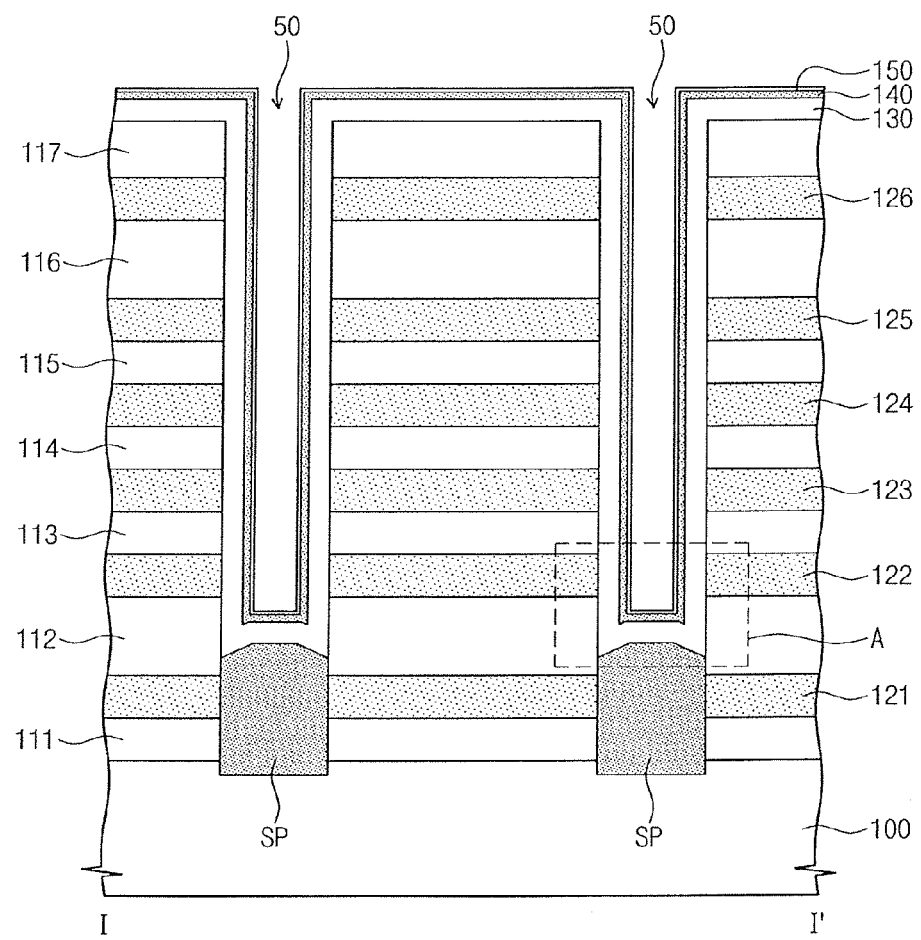

Referring to FIG. 16, a vertical insulating layer 130, a first channel layer 140, and a buffer layer 150 may be sequentially formed to cover an inner surface of the opening 50. The vertical insulating layer 130 may be formed to conformally cover the inner surface of the opening 50, the top surface of the lower channel SP exposed by the opening 50, and the top surface of the mold structure. The first channel layer 140 may be formed to conformally cover side, bottom, and top surfaces of the vertical insulating layer 130. The buffer layer 150 may be formed to conformally cover side, bottom, and top surfaces of the first channel layer 140. The vertical insulating layer 130, the first channel layer 140, and the buffer layer 150 may be formed by using, for example, an atomic layer deposition (ALD) process or a chemical vapor deposition (CVD) process. The vertical insulating layer 130 may be formed to have a single or multi-layered structure. The vertical insulating layer 130 may include at least one layer serving as a memory element of a charge-trap-type nonvolatile memory transistor (e.g., a data storing layer).

Figure 17:
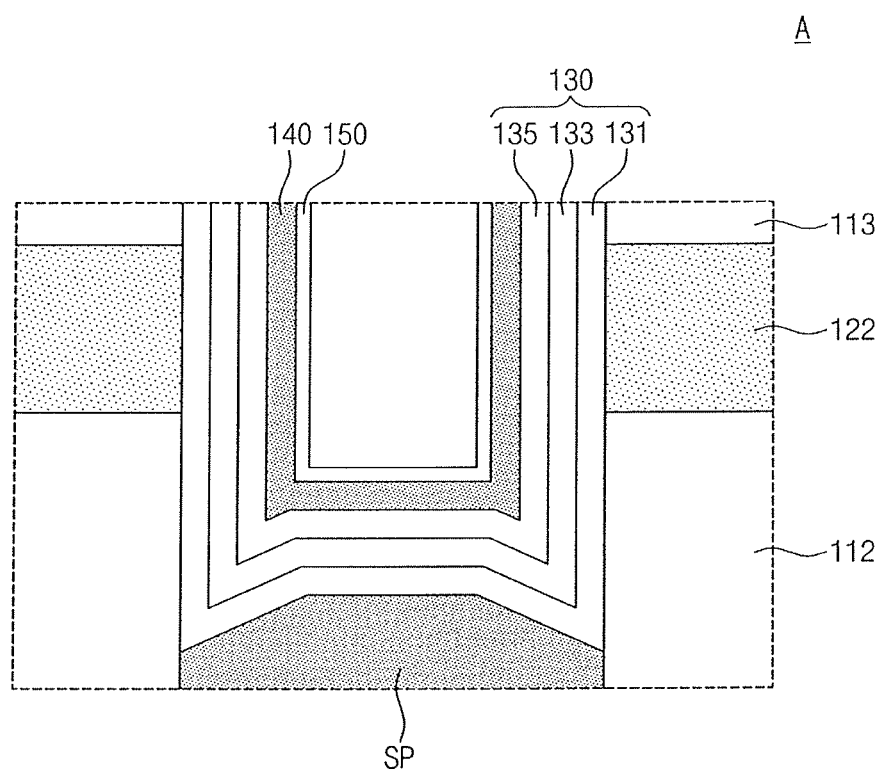
FIGS. 17, 19, 21 and 23 are enlarged views of a portion A of FIG. 16, according to exemplary embodiments of the inventive concept.

As shown in FIG. 17, the vertical insulating layer 130 may include a first vertical insulating layer 131, a second vertical insulating layer 133, and a third vertical insulating layer 135 which are sequentially stacked in the opening 50. The first vertical insulating layer 131 may serve as the blocking insulating layer BLL, the second vertical insulating layer 133 may serve as the trap insulating layer TTL, and the third vertical insulating layer 135 may serve as the tunnel insulating layer TL. The first vertical insulating layer 131 may be formed of a silicon oxide layer, the second vertical insulating layer 133 may be formed of a silicon nitride layer, and the third vertical insulating layer 135 may be formed of a silicon oxynitride layer or high-k dielectric layers (e.g., metal oxide materials). The first channel layer 140 may be formed of or include, for example, a poly silicon layer. In some cases, the first channel layer 140 may be formed of or include at least one of organic semiconductor materials or carbon nano structures. The buffer layer 150 may include an insulating material (e.g., silicon oxide).

Figure 18:
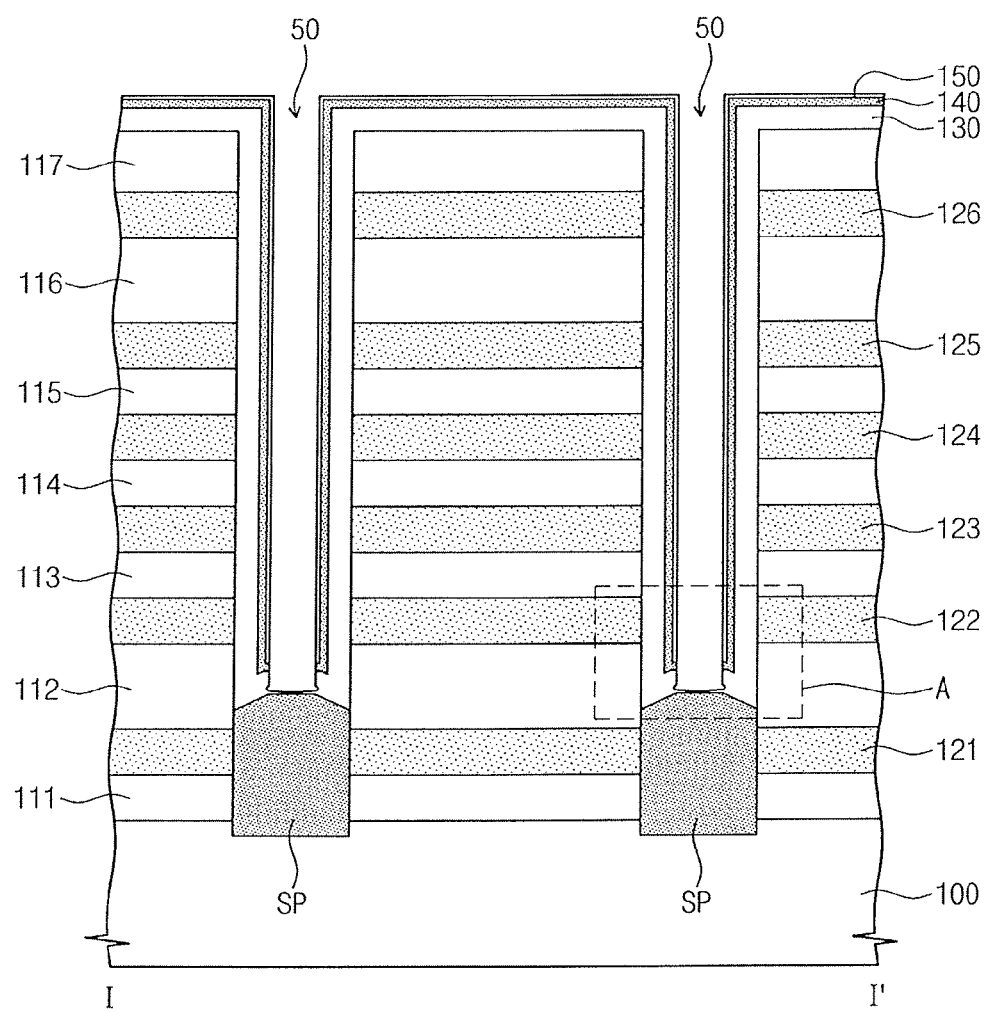

Referring to FIG. 18, a dry etching process may be performed to etch a bottom of the opening 50. For example, the dry etching process may be performed to sequentially etch the buffer layer 150, the first channel layer 140, and the vertical insulating layer 130 stacked on the uppermost surface of the lower channel SP. In the dry etching process, the vertical insulating layer 130 may serve as an etch stop layer, and thus, an upper portion of the vertical insulating layer 130 may be etched to prevent the uppermost surface of the lower channel SP being exposed.

Figure 19:
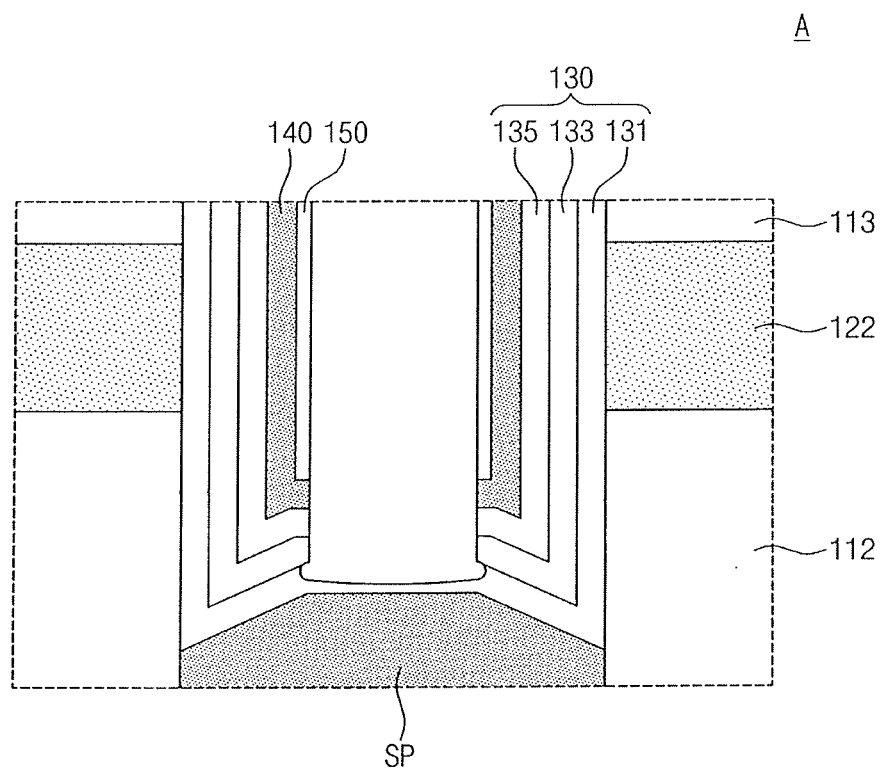

In an exemplary embodiment of the inventive concept, as shown in FIG. 19, the first vertical insulating layer 131 may be used as the etch stop layer. The buffer layer 150, the first channel layer 140, the third vertical insulating layer 135, and the second vertical insulating layer 133, respectively, disposed above the uppermost surface of the lower channel SP, may be partially removed. The top surface of the first vertical insulating layer 131 disposed above the uppermost surface of the lower channel SP may be partially exposed (e.g., removed). The top surface of the first vertical insulating layer 131 may be partially recessed in such a way to prevent the uppermost surface of the lower channel SP from being exposed. In other words, although the top surface of the first vertical insulating layer 131 is partially recessed, it covers the uppermost surface of the lower channel SP.

With reference to FIG. 19, as a result of the dry etching process, the buffer layer 150, the first channel layer 140, the third vertical insulating layer 135, and the second vertical insulating layer 133 may be formed to have vertical inner side surfaces. The vertical inner side surfaces of the buffer layer 150, the first channel layer 140, the third vertical insulating layer 135, and the second vertical insulating layer 133 are formed from the dry etching process and are disposed, for example, perpendicular to the top surface of the substrate 100.

Figure 20:
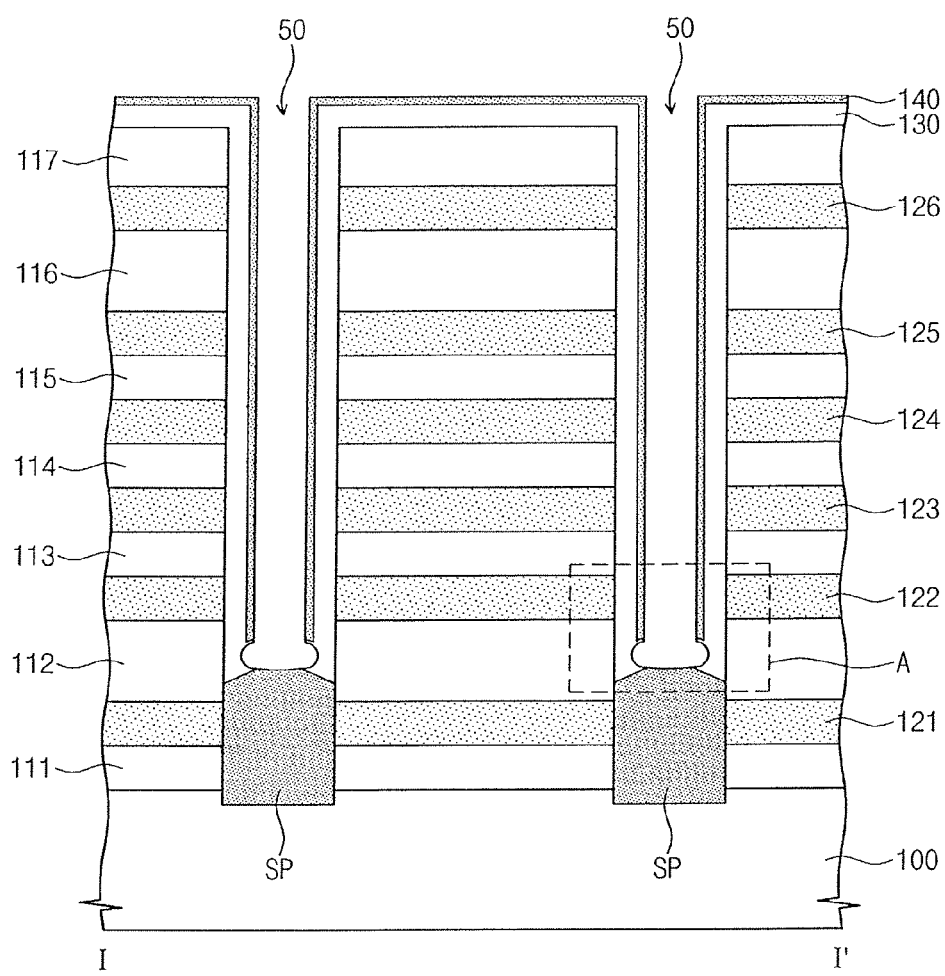
Figure 21:
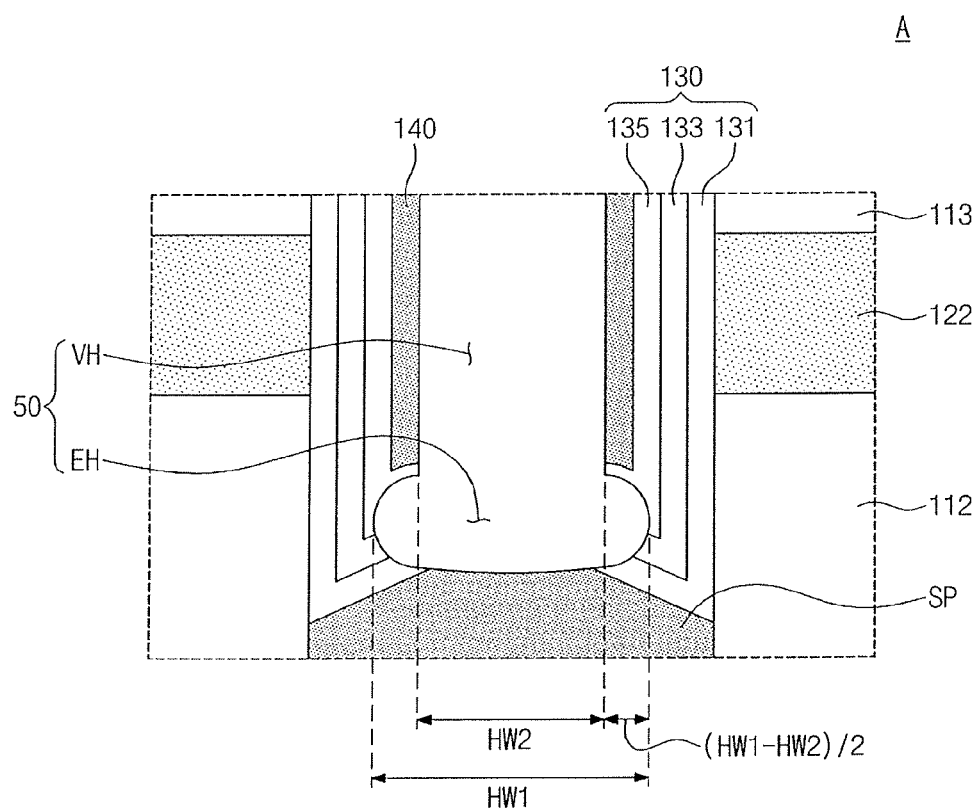

Referring to FIGS. 20 and 21, a wet etching process may be performed to etch the vertical insulating layer 130 exposed in the opening 50. The wet etching process may be performed to form an expanded hole EH exposing the uppermost surface of the lower channel SP. In other words, the expanded hole EH may be formed by selectively removing a portion of the vertical insulating layer 130 positioned in the opening 50 and exposed by the first channel layer 140, and the expanded hole EH may expose the uppermost surface of the lower channel SP. The buffer layer 150 may be removed during the wet etching process, and in this case, a side surface (e.g., an inner surface) of the first channel layer 140 may be exposed in the opening 50. The wet etching process may be performed using at least one of various etching solutions, such as chlorine-ion-containing acidic materials, phosphoric acid, hydrofluoric acid, or standard chemical 1 (SC1).

The expanded hole EH may be a lower portion of the opening 50. Hereinafter, the remaining portion of the opening 50, except for the expanded hole EH, will be called a vertical hole VH. The expanded hole EH may be formed to partially expose the uppermost surface of the lower channel SP and the vertical insulating layer 130. For example, the first to third vertical insulating layers 131, 133, and 135 may be partially and laterally exposed by the expanded hole EH. In addition, the expanded hole EH may be formed in such a way that a lateral boundary thereof is not disposed beyond a vertical interface between the side surfaces of the second and third vertical insulating layers 133 and 135. The expanded hole EH may be formed to have a curved side profile. For example, the expanded hole EH may have a concavely curved side surface.

The vertical hole VH may be formed to expose the first channel layer 140. In addition, the vertical hole VH may be formed to have a vertical profile. A width HW2 of the vertical hole VH may be smaller than a width HW1 of the expanded hole EH. The wet etching process may be performed in such a way that the vertical insulating layer 130 is etched by a depth corresponding to about half a difference in width between the expanded and vertical holes EH and VH (e.g., (HW1−HW2)/2). The etching depth of the vertical insulating layer 130 may be less than a deposition width of the vertical insulating layer 130.

In an exemplary embodiment of the present invention, as shown in FIG. 10A, the expanded hole EH may be formed to have a vertical side profile. In an exemplary embodiment of the present invention, as shown in FIG. 10B, the expanded hole EH may be formed to include a portion with a vertical side profile and another portion with a curved profile. The curved portion of the expanded hole EH may have a concavely curved profile. The portion of the expanded hole EH with the vertical side profile may be formed to expose a portion of the second vertical insulating layer 133, which will be used as the trap insulating layer TTL, and the another portion of the expanded hole EH with the curved profile may be formed to expose a portion of the first vertical insulating layer 131, which will be used as the tunnel insulating layer TL.

Figure 22:
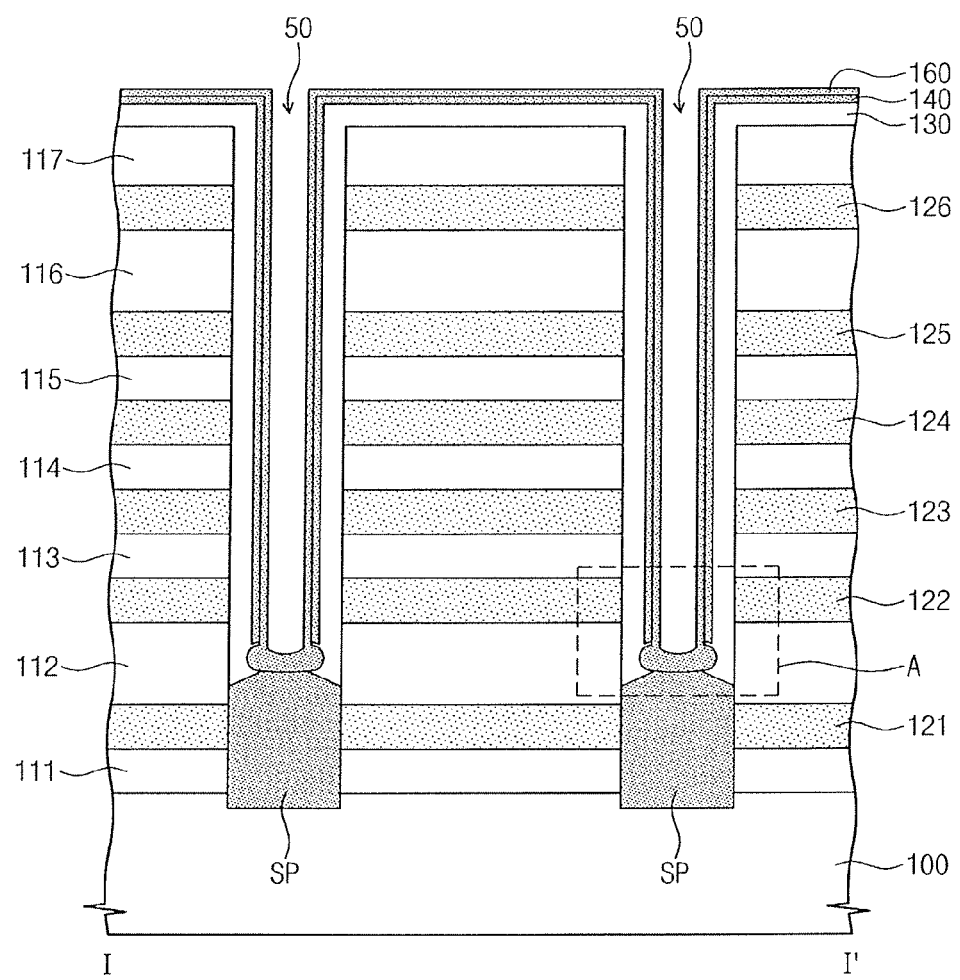
Figure 23:
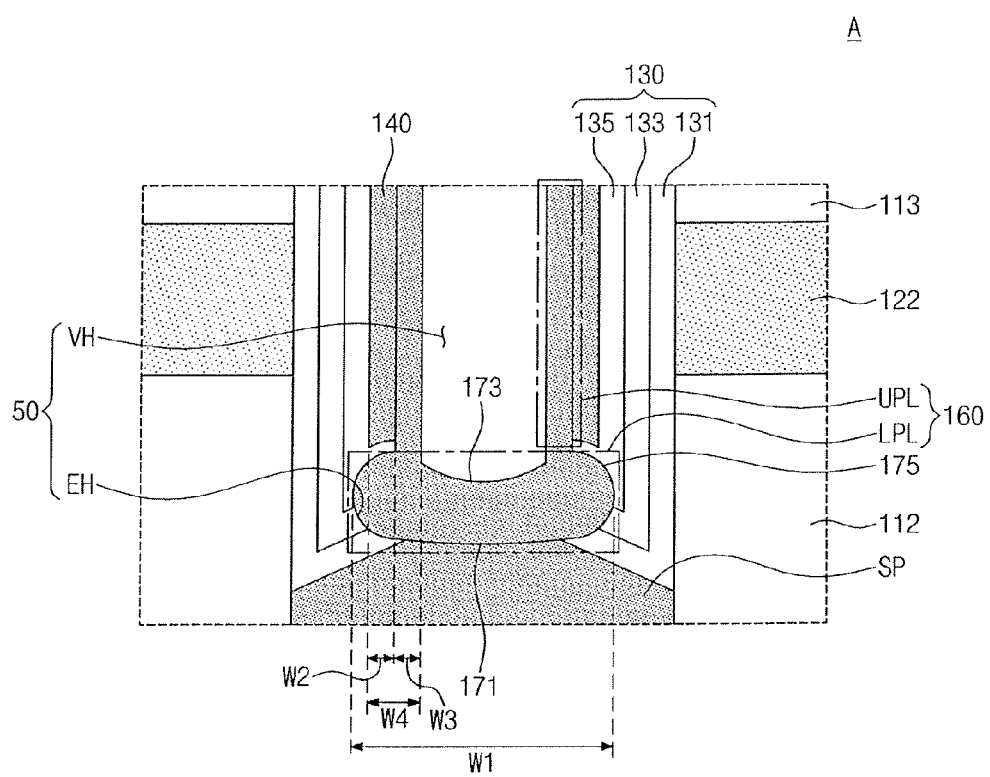

Referring to FIGS. 22 and 23, a second channel layer 160 may be formed on the first channel layer 140. The second channel layer 160 may be formed to fill the expanded hole EH. For example, the second channel layer 160 may be formed to include portions covering the uppermost surface of the lower channel SP, the vertical insulating layer 130 exposed by the side surface of the expanded hole EH, and the bottom surface of the first channel layer 140. The second channel layer 160 may fill at least the expanded hole EH. The second channel layer 160, disposed on the first channel layer 140, may be formed to have a large thickness, allowing the second channel layer 160 to fill the expanded hole EH. In certain cases, a trimming process may be further performed to reduce a thickness of the second channel layer 160 to be formed on the side surface of the first channel layer 140. The trimming process may make it possible for the second channel layer 160 to have a small thickness on the first channel layer 140 and a large thickness in the expanded hole EH. The second channel layer 160 may correspond to the second channel pattern CP2.

The second channel layer 160 may include a lower second channel layer LPL and an upper second channel layer UPL. The lower second channel layer LPL may be a portion of the second channel layer 160 filling the expanded hole EH. The lower second channel layer LPL may correspond to the lower second channel pattern LP. The upper second channel layer UPL may correspond to the upper second channel pattern UP. The lower second channel layer LPL may be in contact with a portion of the vertical insulating layer 130 exposed by the expanded hole EH. For example, portions of the first to third vertical insulating layers 131, 133, and 135 exposed by the expanded hole EH may be in contact with the side surface 175 of the lower second channel layer LPL. The uppermost surface of the lower channel SP may be in contact with a bottom surface 171 of the lower second channel layer LPL. A top surface 173 of the lower second channel layer LPL may be positioned at a level that is lower than or coplanar with the bottom surface of the first channel layer 140, with respect to the substrate 100. In an exemplary embodiment of the inventive concept, as shown in FIGS. 8 and 9, the top surface 173 of the second channel layer 160 may be positioned at a higher level than the bottom surface of the first channel layer 140, with respect to the substrate 100. The upper second channel layer UPL may be formed in the vertical hole VH to conformally cover a side surface of the first channel layer 140 (e.g., the inner side surface of the first channel layer 140).

The width W1 of the lower second channel layer LPL may be larger than the width W3 of the upper second channel layer UPL. Furthermore, the width W1 of the lower second channel layer LPL may be larger than a sum W4 of the width W2 of the first channel layer 140 and the width W3 of the upper second channel layer UPL, which are formed in the vertical hole VH.

The second channel layer 160 may be formed using, for example, the ALD process or the CVD process. The second channel layer 160 may be formed of, for example, a poly silicon layer. In certain cases, the second channel layer 160 may be formed of or include at least one of organic semiconductor materials or carbon nano structures.

To fabricate a semiconductor memory device, a channel pattern may need to have a small thickness at a region adjacent to memory cells and a large thickness at a region adjacent to the ground selection transistor. To increase a thickness of the channel pattern adjacent to the ground selection transistor, a second etching process may be performed to selectively etch a bottom portion of the vertical insulating layer adjacent to the ground selection transistor in a horizontal direction.

According to an exemplary embodiment of the inventive concept, the vertical insulating layer may be used as an etch stop layer preventing an upper portion of the lower channel from being etched in the first etching process. For example, the first etching process may be performed to leave a portion of the vertical insulating layer on the top surface of the lower channel. The second etching process may be performed to etch not only a lower portion of the vertical insulating layer adjacent to the ground selection transistor but also the portion of the vertical insulating layer remaining on the top surface of the lower channel. Accordingly, the bottom portion of the opening can be formed to have a uniform profile, and the second channel layer can be uniformly formed.

Figure 24:
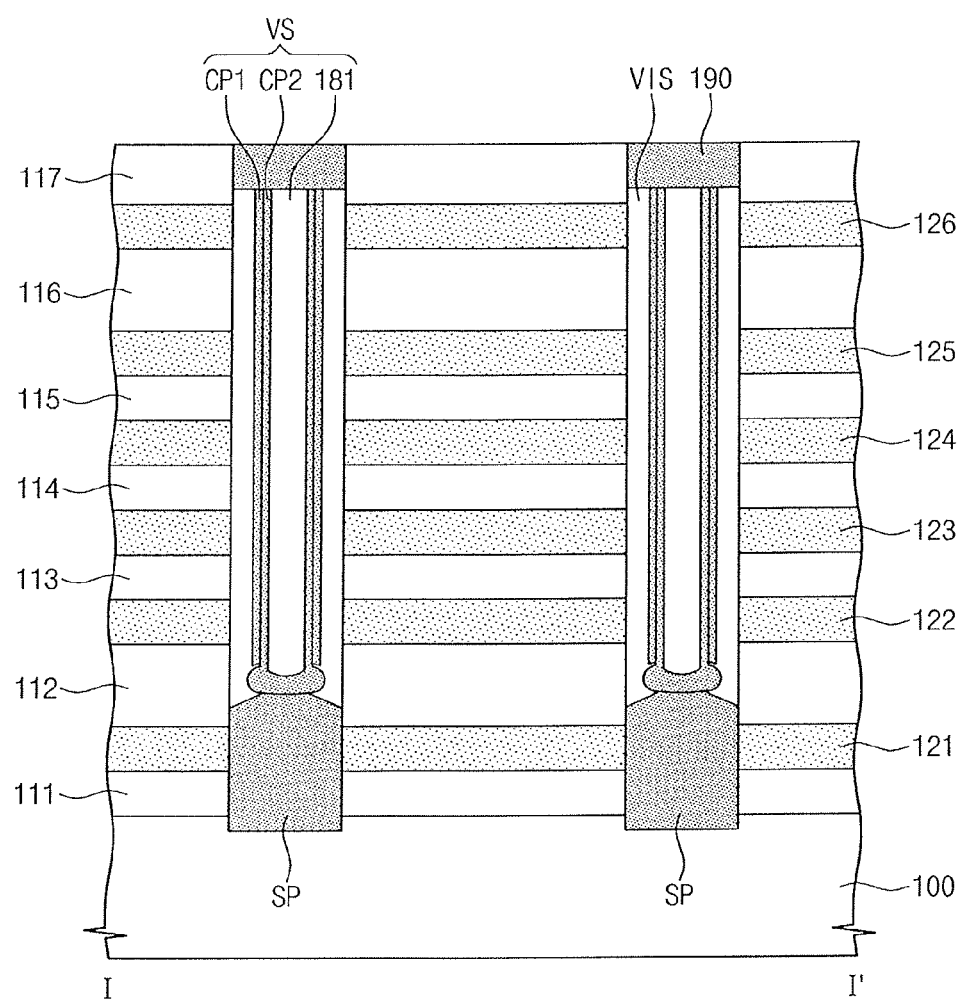

Referring to FIG. 24, the capping pattern 181 may be formed to fill the opening 50. The capping pattern 181 may be formed by forming a capping layer on the mold structure to fill an empty space of the opening 50, and then a planarization process may be performed on the mold structure provided with the capping layer to expose the top surface of the uppermost insulating layer 117. Accordingly, the capping layer, the second channel layer 160, the first channel layer 140, and the vertical insulating layer 130 may be removed from the top surface of the mold structure. Thus, the vertical insulating structure VIS, the first channel pattern CP1, the second channel pattern CP2, and the capping pattern 181 may be formed in the opening 50. The vertical insulating structure VIS may include the tunnel insulating layer TL, the trap insulating layer TTL, and the blocking insulating layer BLL (e.g., described with reference to FIG. 3), which are formed from the first to third insulating layers 131, 133, and 135.

A hydrogen annealing step may be further performed to thermally treat the first and second channel patterns CP1 and CP2 in a gas ambient containing hydrogen or deuterium. For example, the hydrogen annealing step may be performed before the formation of the capping pattern 181. In this case, crystal defects in the first and second channel patterns CP1 and CP2 may be cured and/or reduced. The capping pattern 181 may be formed by a spin-on-glass (SOG) process. The planarization process may be performed using, for example, an etch-back process or a chemical mechanical polishing (CMP) process. The capping pattern 181 may include an insulating material (e.g., silicon oxide or silicon nitride). The first channel pattern CP1, the second channel pattern CP2, and the capping pattern 181 may serve as the channel structure VS.

The conductive pad 190 may be formed on the vertical insulating structure VIS and the channel structure VS. For example, the formation of the conductive pad 190 may include recessing top regions of the channel structure VS and the vertical insulating structure VIS and filling the recessed region with a conductive material. For example, the conductive pad 190 may be formed by injecting dopants, whose conductivity type is different from that of the first and second channel patterns CP1 and CP2, into the top region of the channel structure VS.

Figure 25:
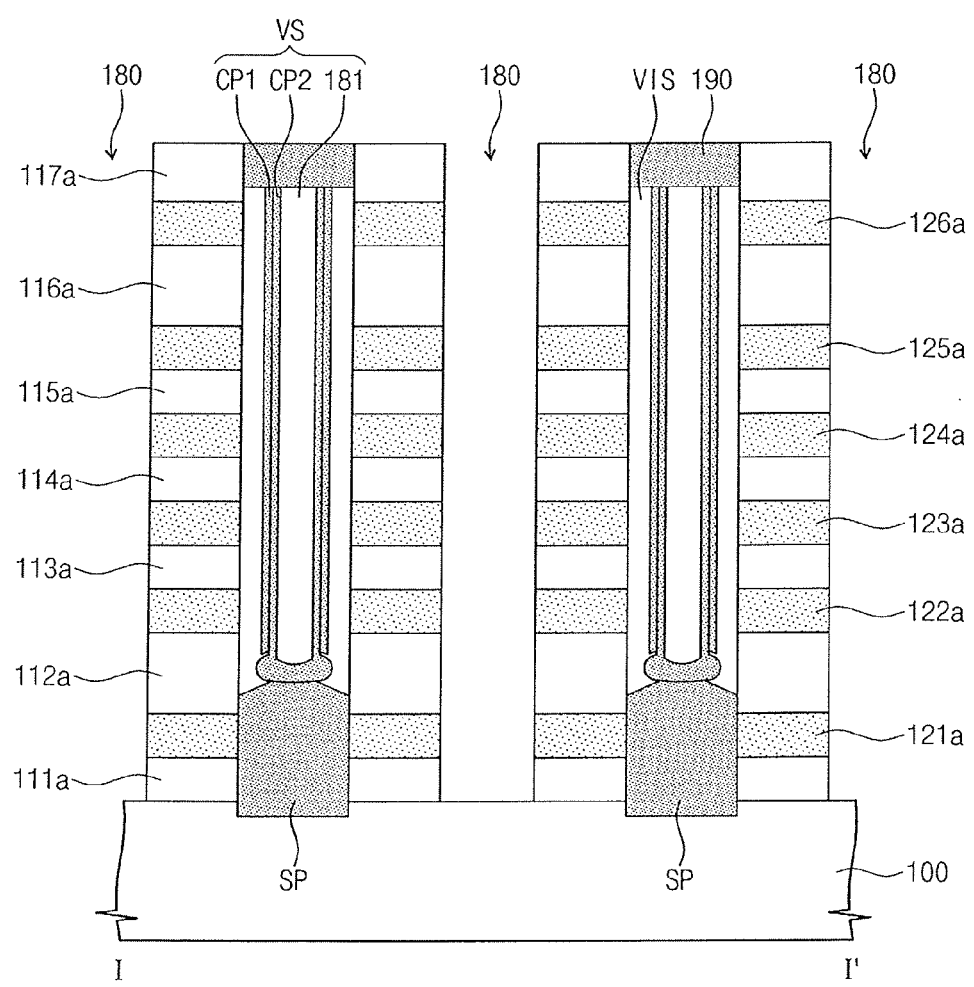

Referring to FIG. 25, the mold structure may be patterned to form the trenches 180. As a result of the patterning process, the insulating patterns 111a-117a and sacrificial patterns 121a-126a alternately stacked on the substrate 100 may be formed. For example, the trenches 180 may be formed to define the insulating patterns 111a-117a and the sacrificial patterns 121a-126a. Each of the channel structures VS may be interposed between a pair of the trenches 180. The trench 180 may be formed to have a side surface exposing the insulating patterns 111a-117a and the sacrificial patterns 121a-126a. The trenches 180 may be formed to have a bottom thereof exposing a portion of the substrate 100. When viewed in a plan view, each of the trenches 180 may be shaped like a line or rectangular bar. The formation of the trenches 180 may include performing an anisotropic etching process on the mold structure.

Figure 26:
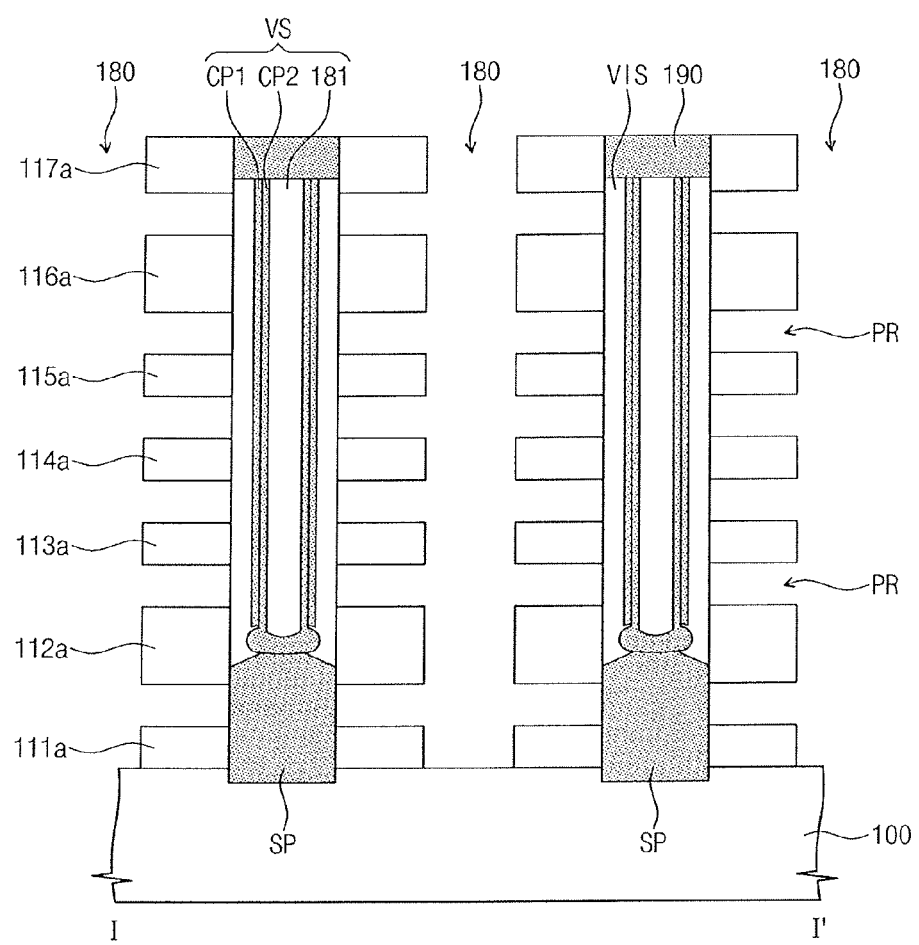

Referring to FIG. 26, the sacrificial patterns 121a-126a exposed by the trenches 180 may be removed to form recess regions PR between the insulating patterns 111a-117a. The recess regions PR may be formed by selectively removing the sacrificial patterns 121a-126a. Due to the above-described difference in etch rate between the sacrificial patterns 121a-126a and the insulating patterns 111a-117a, it is possible to prevent the insulating patterns 111a-117a from being removed in the selective etching process for removing the sacrificial patterns 121a-126a. The selective etching process may be performed using a wet etching process and/or using an isotropic dry etching process. For example, in the case where the sacrificial patterns 121a-126a are formed of silicon nitride and the insulating patterns 111a-117a are formed of silicon oxide, the selective etching process may be performed using etching solution containing phosphoric acid.

Each of the recess regions PR may be formed to expose top and bottom surfaces of the insulating patterns 111a-117a and a portion of an outer side surface of the vertical insulating structure VIS. The lowermost one of the recess regions PR, which is the recess region PR closest to the substrate 100, may be formed to partially expose an outer side surface of the lower channel SP. Each of the recess regions PR may be a gap region that is laterally extended from the trenches 180 and is formed between the insulating patterns 111a-117a.

Figure 27:
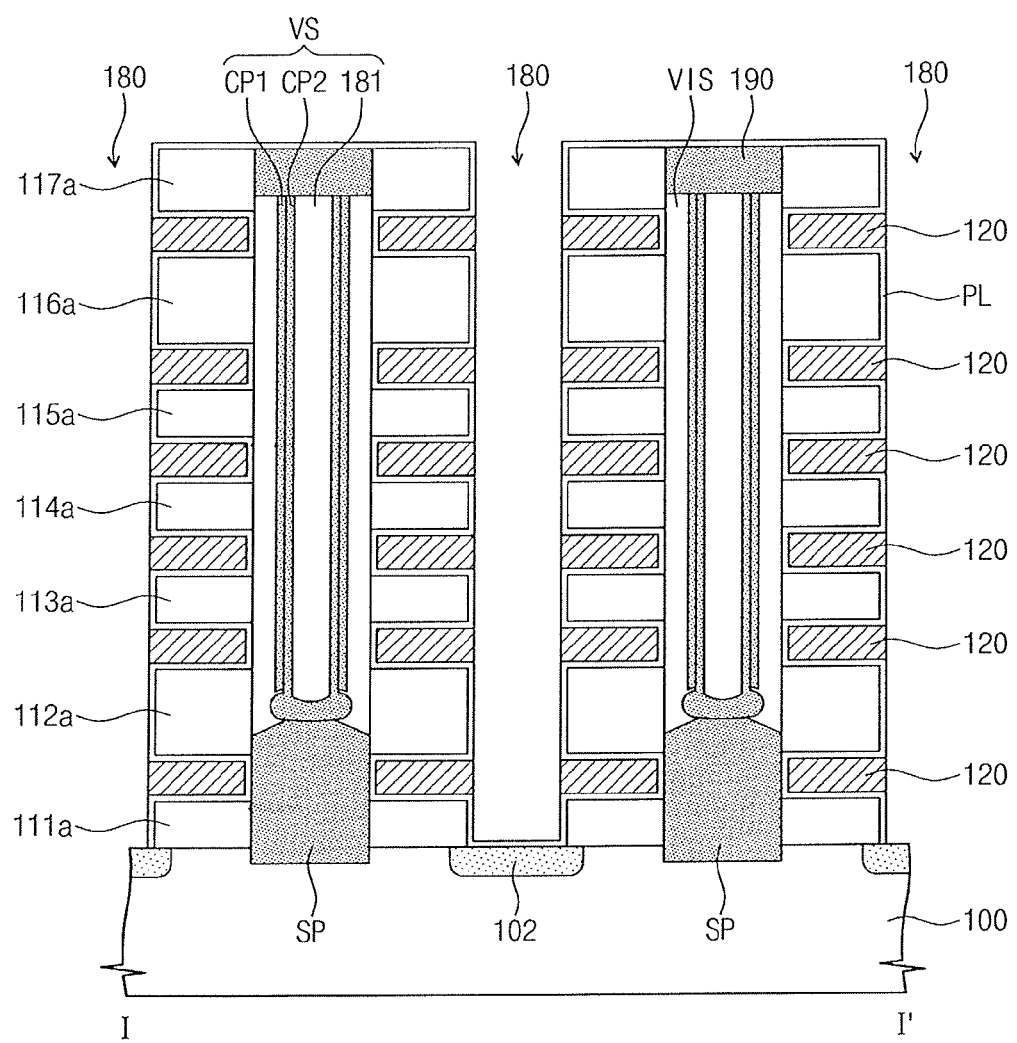

Referring to FIG. 27, the horizontal insulating layer PL may be formed to conformally cover inner surfaces of the recess regions PR. For example, the horizontal insulating layer PL may conformally cover the top and bottom surfaces of the insulating patterns 111a-117a, the exposed outer side surfaces of the vertical insulating structure VIS, and the exposed outer side surfaces of the lower channel SP, which are exposed by the recess regions PR. The horizontal insulating layer PL may also be formed on the top surface of the substrate 100 exposed by the trenches 180, the side surfaces of the insulating patterns 111a-117a exposed by the trenches 180, the top surface of the uppermost insulating pattern 117a, and the top surface of the conductive pad 190.

Similar to the vertical insulating layer 130, the horizontal insulating layer PL may be provided to have a single or multi-layered structure. The horizontal insulating layer PL may serve as a blocking insulating layer of a charge-trap-type nonvolatile memory transistor. For example, the horizontal insulating layer PL may be formed of or include a silicon oxide layer or a high-k dielectric layer. Alternatively, the horizontal insulating layer PL may further include a trap insulating layer or a tunnel insulating layer. The horizontal insulating layer PL may be formed using a deposition process with a good step coverage property. For example, the horizontal insulating layer PL may be formed by using the CVD process or the ALD process.

The gate electrodes 120 may be formed by filling the recess regions PR with a conductive material. The formation of the gate electrodes 120 may include forming a conductive layer to fill the recess regions PR and removing the conductive layer from the trenches 180 to leave the conductive layer in the recess regions PR. The conductive layer may be formed to conformally cover inner surfaces of the trenches 180, and the removal of the conductive layer from the trenches 180 may be performed using an anisotropic etching method. In an exemplary embodiment of the inventive concept, the conductive layer may be formed to fill the trenches 180, and in this case, the removal of the conductive layer from the trenches 180 may be performed using an anisotropic etching method.

After the formation of the gate electrodes 120, the impurity regions 102 may be formed. For example, an ion implantation process may be performed to form the impurity regions 102 in the substrate 100 exposed by the trenches 180. The impurity regions 102 may be formed to have a different conductivity type from the substrate 100.

Referring back to FIG. 3, the interlayered insulating layer 230 may be formed to fill the trenches 180. The contact plugs 193 may be formed to be respectively connected to the conductive pads 190, and the bit lines BL may be formed on the interlayered insulating layer 230 to connect the contact plugs 193. The interlayered insulating layer 230 may be formed of, for example, a silicon oxide layer, a silicon nitride layer, or a silicon oxynitride layer. The contact plug 193 may be formed to contain at least one of doped silicon or metallic materials. The bit lines BL may be electrically connected to the first and second channel patterns CP1 and CP2 through the contact plugs 193 and may be formed to cross the gate electrodes 120 or the trenches 180.

FIGS. 28, 30, 32, 34 and 35 are sectional views illustrating a method of fabricating a semiconductor memory device, according to an exemplary embodiment of the inventive concept. FIGS. 29, 31 and 33 are enlarged views of a portion B of FIG. 28, according to exemplary embodiments of the inventive concept.

A duplicate description of elements and features described above may be omitted for brevity.

Figure 28:
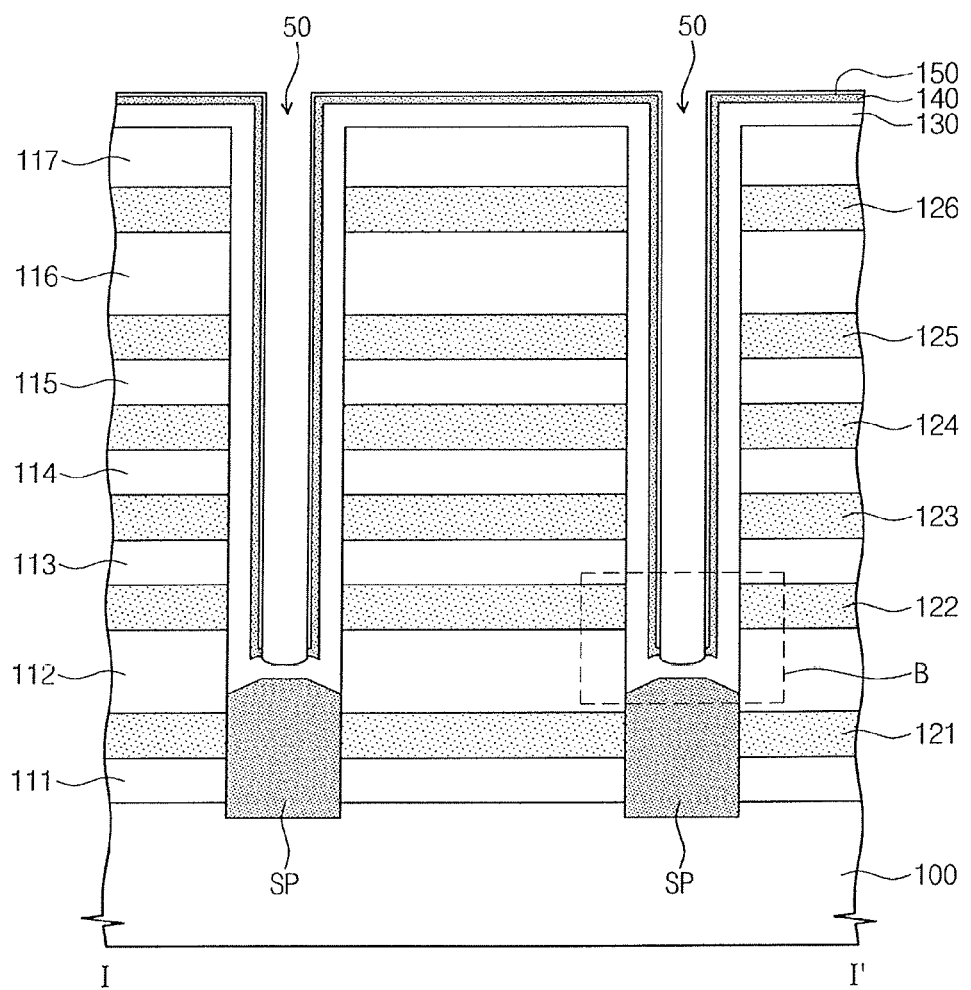
FIGS. 28, 30, 32, 34 and 35 are sectional views illustrating a method of fabricating a semiconductor memory device, according to an exemplary embodiment of the inventive concept.
Figure 29:
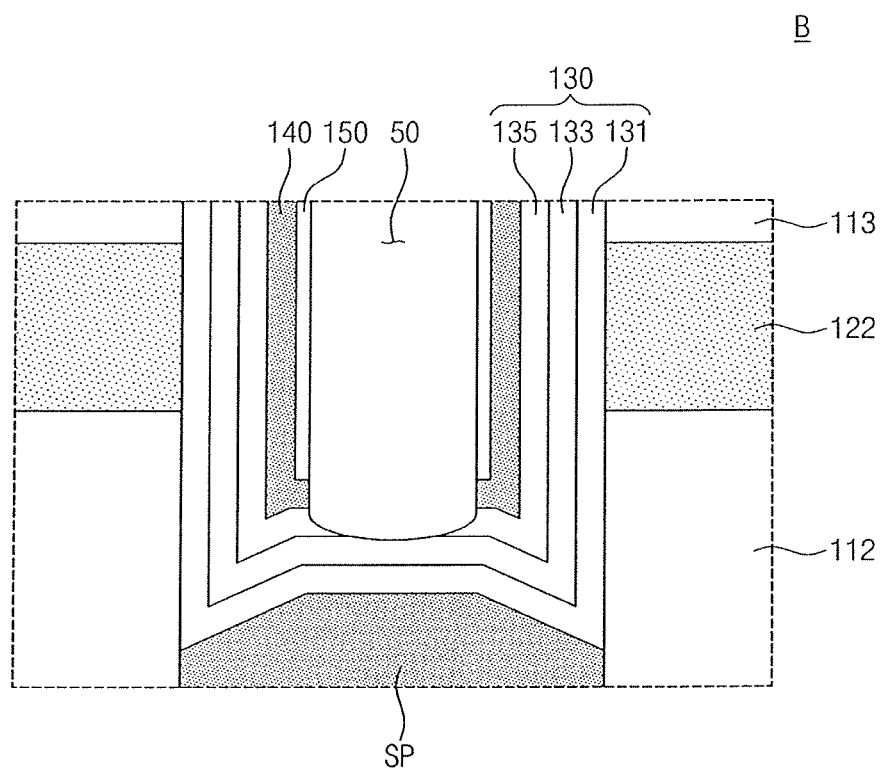
FIGS. 29, 31 and 33 are enlarged views of a portion B of FIG. 28, according to exemplary embodiments of the inventive concept.

Referring to FIGS. 28 and 29, the mold structure may be etched to form an opening 50, for example, anisotropically. Then, the lower channel SP may be formed on the top surface of the substrate 100 exposed by the opening 50. The vertical insulating layer 130, the first channel layer 140, and the buffer layer 150 may be sequentially formed on an inner surface of the opening 50. The vertical insulating layer 130 may include the first vertical insulating layer 131, the second vertical insulating layer 133, and the third vertical insulating layer 135.

A dry etching process may be performed to etch a bottom of the opening 50. For example, the dry etching process may be performed to sequentially etch the buffer layer 150, the first channel layer 140, and the vertical insulating layer 130 formed on the uppermost surface of the lower channel SP. In an exemplary embodiment of the inventive concept, as shown in FIG. 29, the second vertical insulating layer 133 may be used as the etch stop layer. Accordingly, the third vertical insulating layer 135 may be partially removed from the uppermost surface of the lower channel SP by the wet etching process, and the second and first vertical insulating layers 133 and 131 may not be removed and may remain on the uppermost surface of the lower channel SP. The top surface of the second vertical insulating layer 133 may be partially recessed.

As a result of the dry etching process, the buffer layer 150, the first channel layer 140, and the third vertical insulating layer 135 may be formed to have a vertical inner side surfaces. The vertical inner side surfaces of the buffer layer 150, the first channel layer 140, and the third vertical insulating layer 135, are formed from the dry etching process and are disposed, for example, perpendicular to the top surface of the substrate 100.

Figure 30:
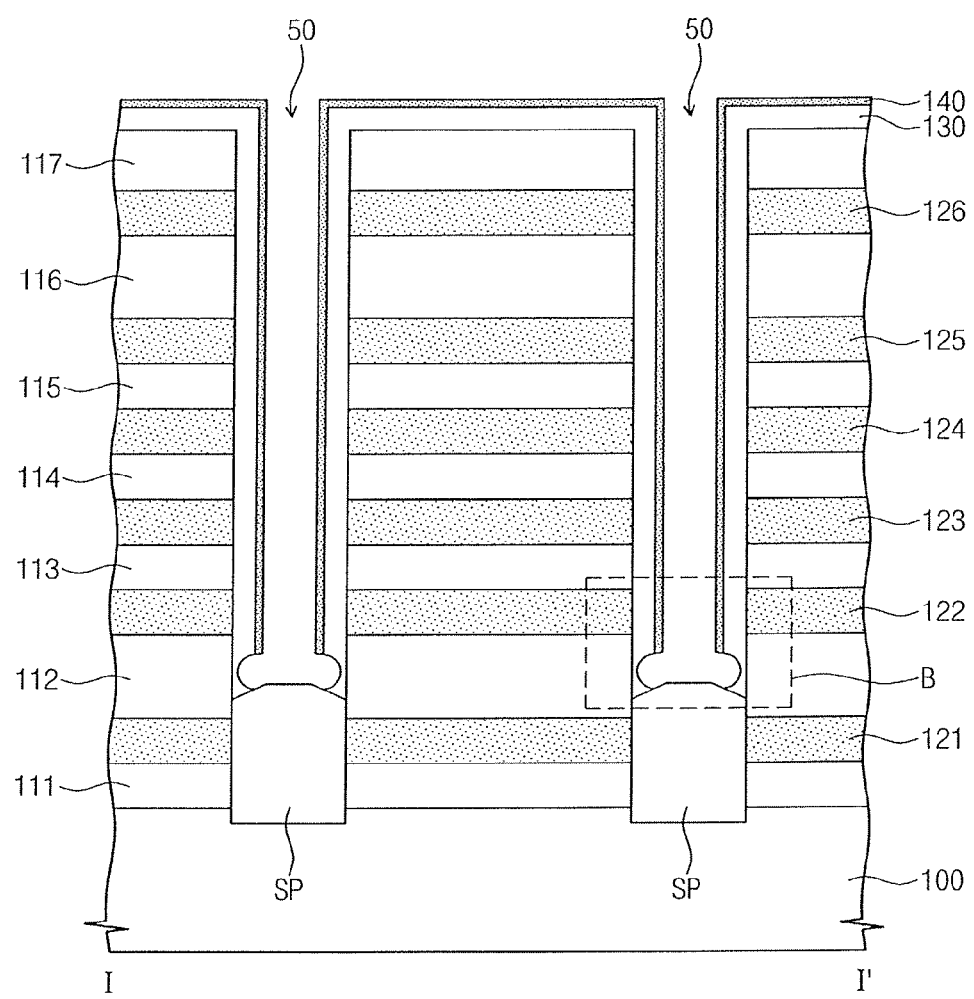
Figure 31:
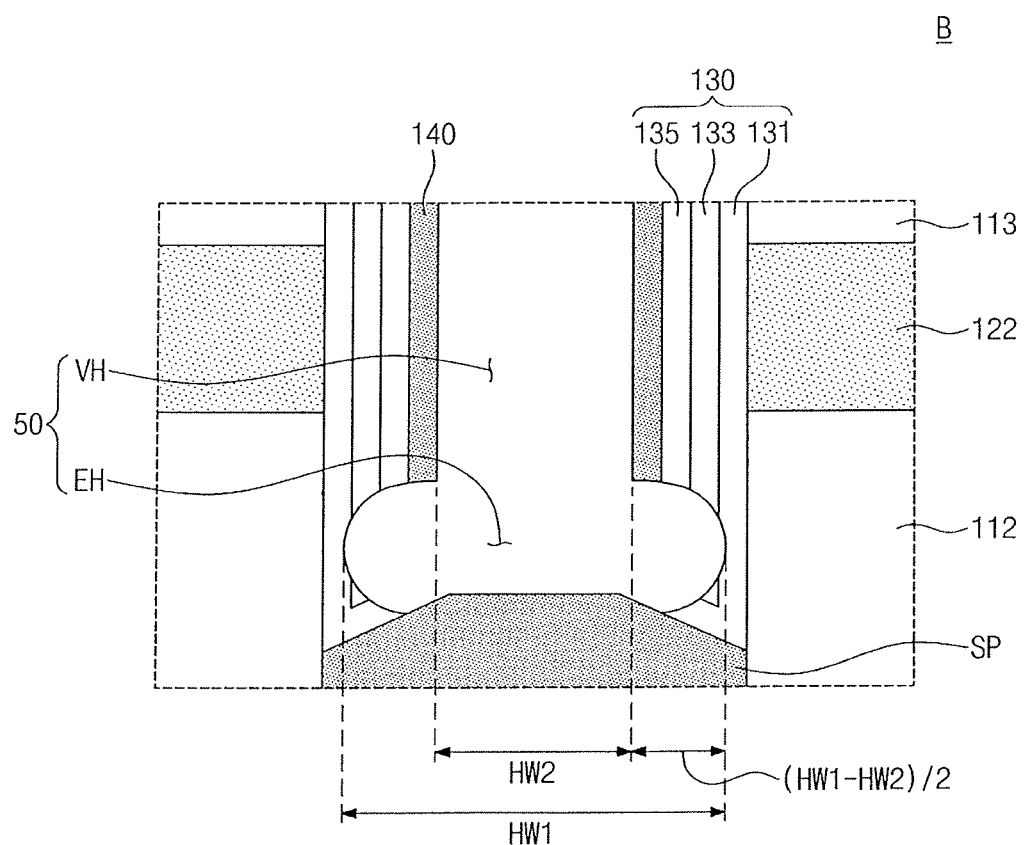

Referring to FIGS. 30 and 31, a wet etching process may be performed to etch the vertical insulating layer 130 exposed in the opening 50. For example, the wet etching process may be performed to form the expanded hole EH exposing the uppermost surface of the lower channel SP. The expanded hole EH may be a lower portion of the opening 50. As described above, the vertical hole VH may refer to the remaining portion of the opening 50, except for the expanded hole EH. The expanded hole EH may be formed to partially expose the uppermost surface of the lower channel SP and the vertical insulating layer 130. For example, the first to third vertical insulating layers 131, 133, and 135 may be partially and laterally exposed by the expanded hole EH. In addition, the expanded hole EH may be formed in such a way that a lateral boundary thereof is not beyond a vertical interface between the first vertical insulating layer 131 and the lower insulating layer 112. The expanded hole EH may be formed to have a curved side profile. For example, the expanded hole EH may have a concavely curved side surface.

The wet etching process may be performed to remove the buffer layer 150, and thus, the first channel layer 140 may be exposed through the vertical hole VH. The wet etching process may be performed in such a way that the vertical insulating layer 130 is etched by a depth corresponding to about half a difference in width between the expanded and vertical holes EH and VH (i.e., (HW1−HW2)/2). The etching depth of the vertical insulating layer 130 may be less than a deposition width of the vertical insulating layer 130.

In an exemplary embodiment of the present invention, as shown in FIG. 12A, the expanded hole EH may be formed to have a vertical side profile. In an exemplary embodiment of the present invention, as shown in FIG. 12B, the expanded hole EH may be formed to include a portion with a vertical side profile and another portion with a curved profile. The curved portion of the expanded hole EH may have a concavely curved profile. The portion of the expanded hole EH with the vertical side profile may be formed to expose a portion of the second vertical insulating layer 135, which will be used as the trap insulating layer TTL, and the another portion of the expanded hole EH with the curved profile may be formed to expose a portion of the first vertical insulating layer 131, which will be used as the tunnel insulating layer TL.

Figure 32:
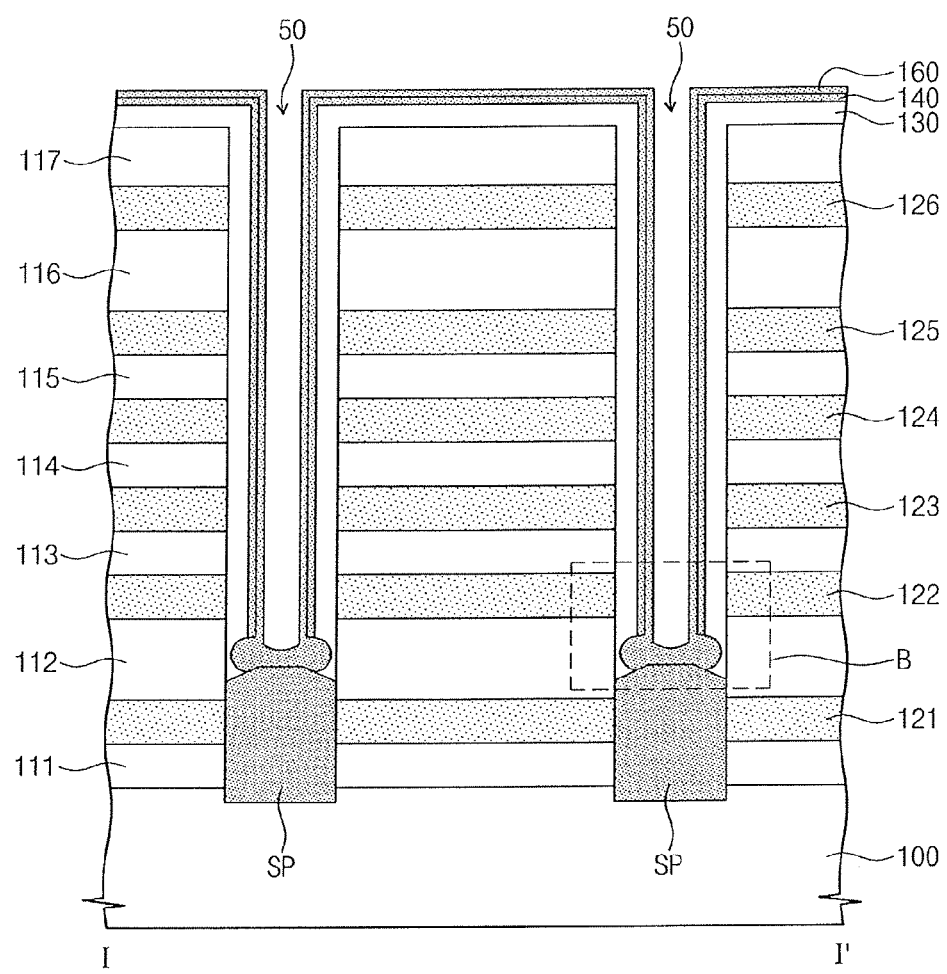
Figure 33:
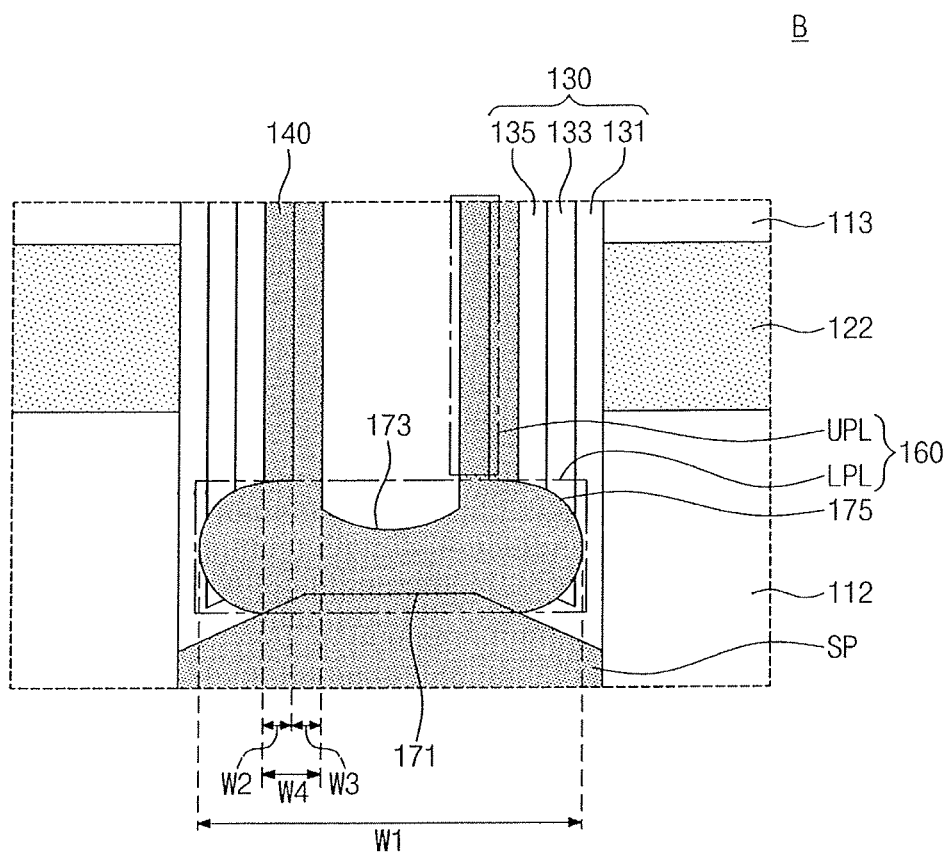

Referring to FIGS. 32 and 33, the second channel layer 160 may be formed on the first channel layer 140. The second channel layer 160 may be formed to fill the expanded hole EH. The second channel layer 160 may include the lower second channel layer LPL and the upper second channel layer UPL. The lower second channel layer LPL may be a portion of the second channel layer 160 filling the expanded hole EH. The side surface 175 of the lower second channel layer LPL may be in contact with a portion of the vertical insulating layer 130 exposed by the expanded hole EH. For example, portions of the first to third vertical insulating layers 131, 133, and 135 exposed by the expanded hole EH may be in contact with the side surface 175 of the lower second channel layer LPL. The uppermost surface of the lower channel SP may be in contact with the bottom surface 171 of the lower second channel layer LPL. The upper second channel layer UPL may be formed in the vertical hole VH to conformally cover a side surface of the first channel layer 140 (e.g., the inner surface of the first channel layer 140).

The width W1 of the lower second channel layer LPL may be larger than the width W3 of the upper second channel layer UPL. In addition, the width W1 of the lower second channel layer LPL may be larger than a sum W4 of the width W2 of the first channel layer 140 and the width W3 of the upper second channel layer UPL, which are formed in the vertical hole VH.

Figure 34:
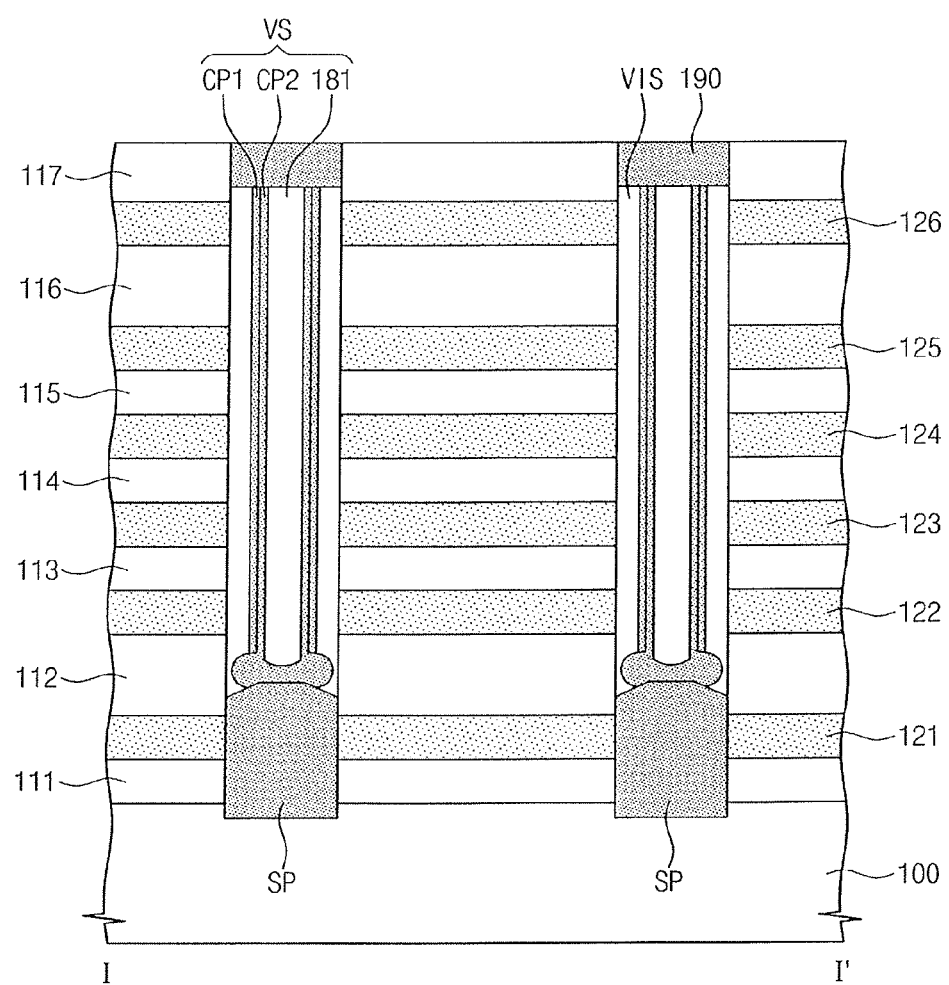
Figure 35:
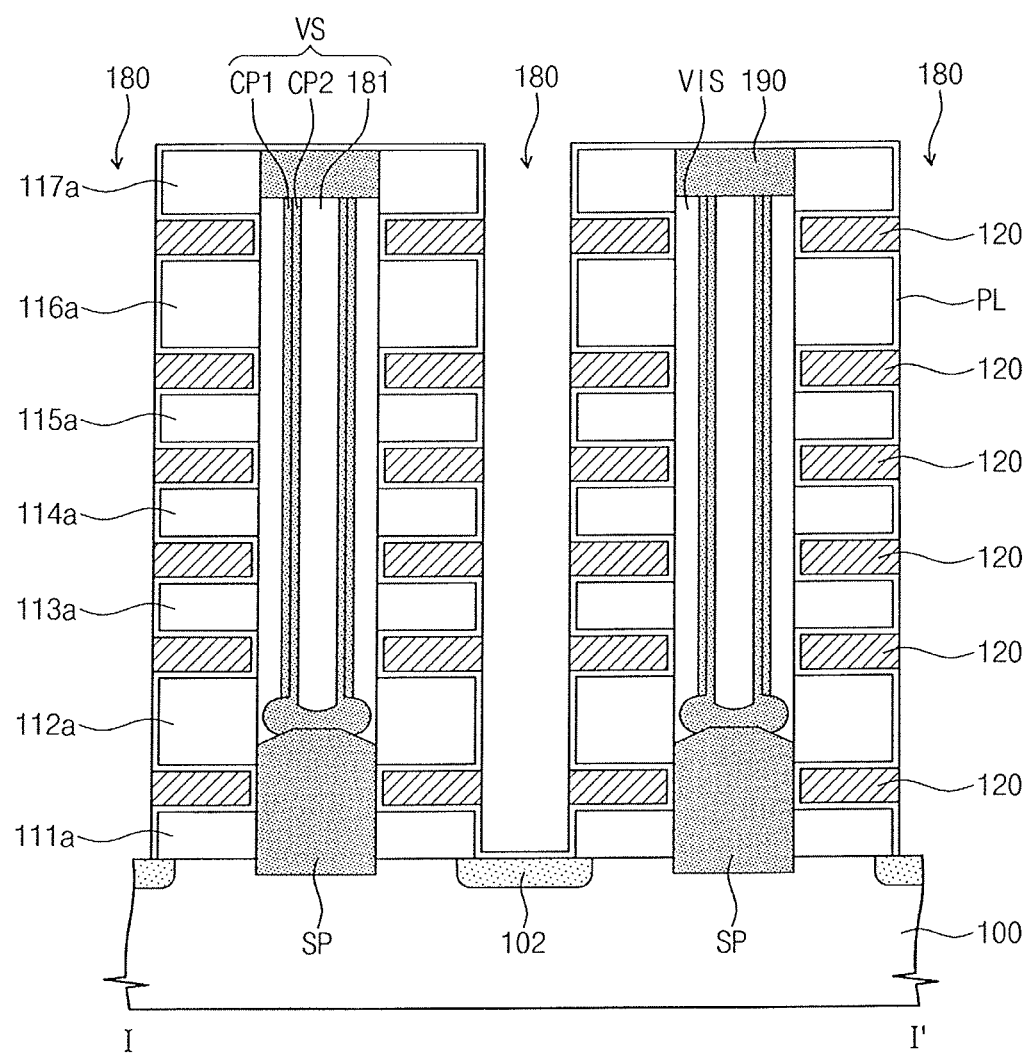

Referring to FIG. 34, a capping layer may be formed to fill the opening 50, and then, a planarization process may be performed on the mold structure provided with the capping layer to expose the top surface of the uppermost insulating layer 117. Accordingly, the capping layer, the second channel layer 160, the first channel layer 140, the vertical insulating layer 130 may be sequentially removed from the top surface of the mold structure. Thus, the vertical insulating structure VIS, the first channel pattern CP1, the second channel pattern CP2, and the capping pattern 181 may be formed in the opening 50.

Figure 36:
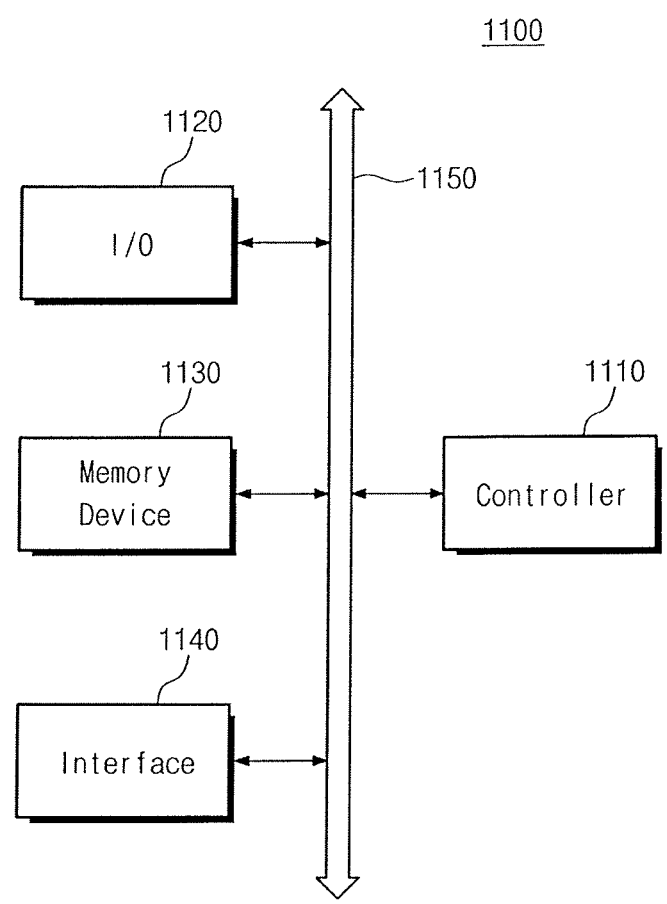
FIG. 36 is a schematic block diagram illustrating an example of a memory system including a semiconductor memory device according to exemplary embodiments of the inventive concept.

FIG. 36 is a schematic block diagram illustrating an example of a memory system including a semiconductor memory device according to exemplary embodiments of the inventive concept.

Referring to FIG. 36, a memory system 1100 may be used to realize information processing devices, such as a personal digital assistant (PDA), portable computers, web tablets, wireless phones, mobile phones, digital music players, memory cards, and wired or wireless communication devices.

The memory system 1100 may include a controller 1110, an input-output unit 1120 (e.g., a keypad, a keyboard, and a display), a memory 1130, an interface 1140, and a bus 1150. The memory 1130 and the interface 1140 may communicate with each other via the bus 1150.

The controller 1110 may include at least one of microprocessor, digital signal processor, a microcontroller, or other similar processing devices. The memory 1130 may be configured to store data or command processed by the controller 1110. The input-output unit 1120 may be configured to receive or output data or signals from or to the system 1100 or the outside of the system 1100. For example, the input-output unit 1120 may include a keyboard, a keypad, or a display device.

The memory 1130 may include a nonvolatile semiconductor memory device according to exemplary embodiments of the inventive concept. The memory 1130 may further include a randomly accessible volatile memory or any other type memory device.

The interface 1140 may be configured to receive or output data or signals from or to a communication network.

Figure 37:
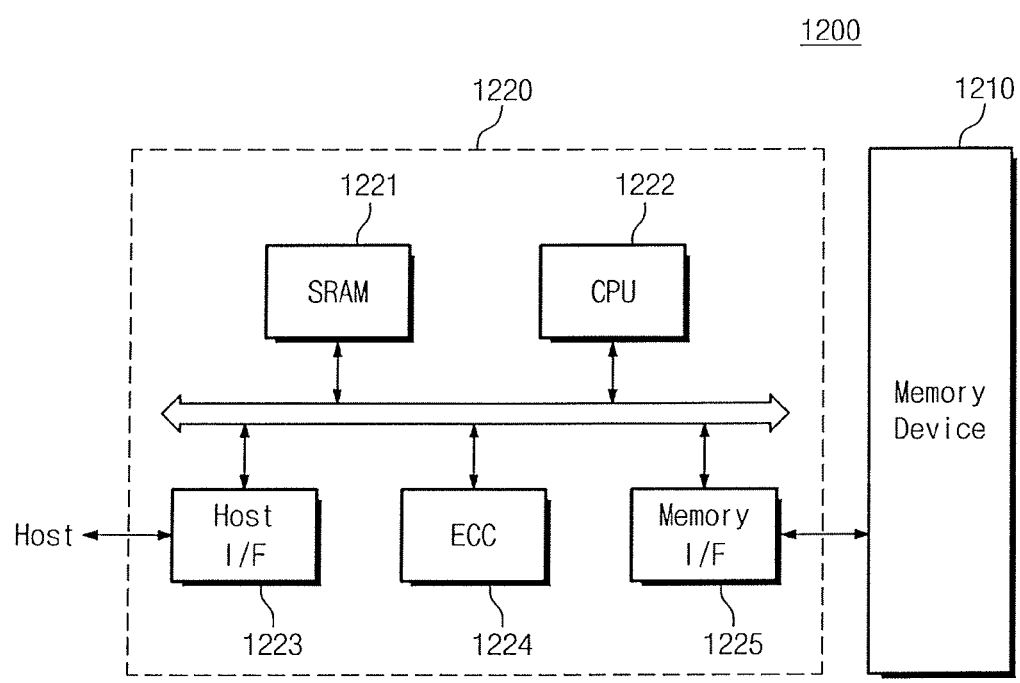
FIG. 37 is a schematic block diagram illustrating an example of a memory card including a semiconductor memory device according to exemplary embodiments of the inventive concept.

FIG. 37 is a schematic block diagram illustrating an example of a memory card including a semiconductor memory device according to exemplary embodiments of the inventive concept.

Referring to FIG. 37, a memory card 1200 may be configured to include a semiconductor memory device 1210, which may be one of the semiconductor memory devices according to exemplary embodiments of the inventive concept. The memory card 1200 may include a memory controller 1220 configured to control a data exchange operation between a host and the semiconductor memory device 1210.

A static random access memory (SRAM) 1221 may be used as an operation memory of a processing unit 1222. A host interface 1223 may be configured to include data exchange protocols of a host to be connected to the memory card 1200. An error correction block 1224 may be configured to detect and correct errors included in data readout from the semiconductor memory device 1210. A memory interface 1225 may be configured to interface with the semiconductor memory device 1210.

The processing unit 1222 performs every control operation for exchanging data of the memory controller 1220. Even though not depicted in drawings, it is apparent to one of ordinary skill in the art that the memory card 1200 according to exemplary embodiments of the inventive concept may further include a read-only memory (ROM) not shown storing code data for interfacing with the host.

Figure 38:
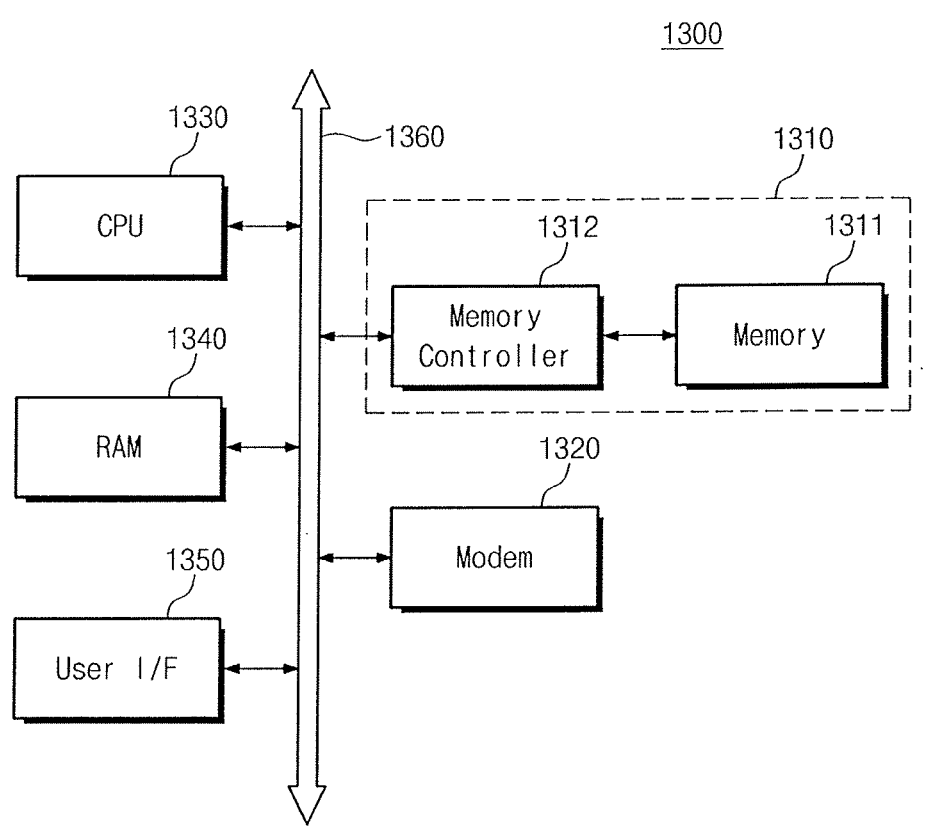
FIG. 38 is a schematic block diagram illustrating an example of an information processing system including a semiconductor memory device according to exemplary embodiments of the inventive concept.

FIG. 38 is a schematic block diagram illustrating an example of an information processing system including a semiconductor memory device according to exemplary embodiments of the inventive concept.

Referring to FIG. 38, an information processing system 1300, which may be a mobile device and/or a desktop computer, may include a memory system 1310 (e.g., a FLASH memory system). In an exemplary embodiment of the inventive concept, the information processing system 1300 may further include a modem 1320, a central processing unit (CPU) 1330, a random access memory (RAM) 1340, and a user interface 1350 electrically connected to the memory system 1310 through a system bus 1360. The memory system 1310 may be configured in the same manner as the memory system described with reference to FIG. 36. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. This increase in reliability of the memory system 1310 enables the information processing system 1300 to conserve resources for error correction and realize a high speed data exchange function. Although not illustrated, it is apparent to those skilled in the art that, for example, an application chipset, a camera image sensor, a camera image signal processor (CIS), an input/output device, or the like may further be included in the information processing system 1300 according to the inventive concept.

Semiconductor memory devices or memory systems according to exemplary embodiments of the inventive concept can be packaged using any of various types of packages. For example, a semiconductor memory device according to exemplary embodiments of the inventive concept can be packaged and mounted using methods such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multichip package (MCP), wafer-level fabricated package (WFP), and wafer-level processed stack package (WSP).

According to exemplary embodiments of the inventive concept, a semiconductor memory device may include a channel pattern whose thickness is thicker near a ground selection transistor than near a memory cell transistor. Such a difference in thickness of the channel pattern may allow the semiconductor memory device to have increased reliability.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor memory device, comprising:
   a stack including gate electrodes sequentially stacked on a substrate;
   a vertical insulating structure penetrating the stack vertically with respect to the gate electrodes;
   a vertical channel portion disposed on an inner surface of the vertical insulating structure;
   a lower channel penetrating a lower portion of the stack and disposed between the vertical channel portion and the substrate;
   a capping pattern disposed in an inner space surrounded by the vertical channel portion; and
   a common source region formed in the substrate and spaced apart from the vertical channel portion,
   wherein the lower channel includes an uppermost surface and top surfaces positioned at both sides of the uppermost surface, and the top surfaces are gradually inclined with respect to a top surface of the substrate,
   wherein a bottom surface of the vertical insulating structure is gradually inclined with respect to the top surface of the substrate, and
   wherein the capping pattern has a width varying depending on a distance from the lower channel.

2. The semiconductor memory device of claim 1, wherein the vertical channel portion comprises a first channel pattern and a second channel pattern, the first channel pattern partially covers an inner surface of the vertical insulating structure, and the second channel pattern includes an upper second channel pattern covering an inner surface of the first channel pattern and a lower second channel pattern disposed below the first channel pattern.

3. The semiconductor memory device of claim 2, wherein the lower second channel pattern covers a bottom surface of the first channel pattern.

4. The semiconductor memory device of claim 2, wherein a sidewall of the lower second channel pattern contacts the vertical insulating structure,
   wherein the sidewall of the lower second channel pattern is curved.

5. The semiconductor memory device of claim 2, wherein the lower second channel pattern has a protruding sidewall toward the vertical insulating structure.

6. The semiconductor memory device of claim 2, wherein the lower channel contacts the second channel pattern and is spaced apart from the first channel pattern.

7. The semiconductor memory device of claim 1, wherein the bottom surface of the vertical insulating structure contacts one of the top surfaces of the lower channel.

8. The semiconductor memory device of claim 1, wherein the width of the capping pattern increases farther away from the lower channel.

9. The semiconductor memory device of claim 1, wherein a bottom surface of the capping pattern is positioned over the bottom surface of the vertical insulating structure.

10. The semiconductor memory device of claim 1, wherein the vertical channel portion contacts the uppermost surface of the lower channel and is spaced apart from the top surfaces of the lower channel.

11. The semiconductor memory device of claim 1, wherein a bottom surface of the capping pattern is curved.

* * * * *